United States Patent
Yamauchi et al.

(10) Patent No.: US 7,456,096 B2
(45) Date of Patent: Nov. 25, 2008

(54) METHOD OF MANUFACTURING SILICIDE LAYER FOR SEMICONDUCTOR DEVICE

(75) Inventors: Takashi Yamauchi, Yokohama (JP); Atsuhiro Kinoshita, Kamakura (JP); Yoshinori Tsuchiya, Yokohama (JP); Junji Koga, Yokosuka (JP); Koichi Kato, Yokohama (JP); Nobutoshi Aoki, Yokohama (JP); Kazuya Ohuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 11/530,724

(22) Filed: Sep. 11, 2006

(65) Prior Publication Data
US 2007/0141836 A1    Jun. 21, 2007

(30) Foreign Application Priority Data
Dec. 16, 2005   (JP) ............................. 2005-363813

(51) Int. Cl.
*H01L 29/45* (2006.01)
(52) U.S. Cl. .................. 438/630; 438/664; 438/682; 257/E21.165; 257/E21.627; 257/E21.641
(58) Field of Classification Search .............. 438/630, 438/664, 682; 257/E21.165, E21.627, E21.641
See application file for complete search history.

(56) References Cited

U.S. PATENT DOCUMENTS

| | | | | |
|---|---|---|---|---|
| 4,908,331 A | * | 3/1990 | Raaijmakers | 438/682 |
| 5,937,315 A | * | 8/1999 | Xiang et al. | 438/486 |
| 6,297,148 B1 | * | 10/2001 | Besser et al. | 438/636 |
| 6,329,276 B1 | * | 12/2001 | Ku et al. | 438/586 |
| 6,740,587 B2 | * | 5/2004 | Song et al. | 438/682 |
| 7,202,147 B2 | * | 4/2007 | Okuno et al. | 438/582 |

(Continued)

OTHER PUBLICATIONS

Morimoto, T., et al., Self-Aligned Nickel-Mono-Silicide Technology for High-Speed Deep Submicrometer Logic CMOS ULSI, IEEE Transaction on Electron Devices, vol. 42, No. 5, May 1995, pp. 915-922.*

(Continued)

*Primary Examiner*—George Fourson
(74) *Attorney, Agent, or Firm*—Oblon, Spivak, McClelland, Maier & Neustadt, P.C.

(57) ABSTRACT

It is made possible to reduce the interface resistance at the interface between the nickel silicide film and the silicon. A semiconductor manufacturing method includes: forming an impurity region on a silicon substrate, with impurities being introduced into the impurity region; depositing a Ni layer so as to cover the impurity region; changing the surface of the impurity region into a $NiSi_2$ layer through annealing; forming a Ni layer on the $NiSi_2$ layer; and silicidating the $NiSi_2$ layer through annealing.

6 Claims, 21 Drawing Sheets

U.S. PATENT DOCUMENTS

| | | | | |
|---|---|---|---|---|
| 2001/0032330 A1* | 10/2001 | Kusunoki | | 716/8 |
| 2002/0036353 A1* | 3/2002 | Song et al. | | 257/774 |
| 2004/0061228 A1* | 4/2004 | Wieczorek et al. | | 257/750 |
| 2005/0145943 A1* | 7/2005 | Schram et al. | | 257/350 |
| 2005/0250326 A1* | 11/2005 | Matsuda | | 438/682 |
| 2005/0253205 A1* | 11/2005 | Kawamura | | 257/412 |
| 2006/0051596 A1* | 3/2006 | Jensen et al. | | 428/426 |
| 2006/0057844 A1* | 3/2006 | Domenicucci et al. | | 438/655 |
| 2006/0130746 A1* | 6/2006 | Terashima et al. | | 117/95 |
| 2006/0281305 A1* | 12/2006 | Jung et al. | | 438/655 |
| 2007/0004203 A1* | 1/2007 | Streck et al. | | 438/680 |
| 2007/0004205 A1* | 1/2007 | Detavernier et al. | | 438/682 |
| 2007/0018255 A1* | 1/2007 | Kawamura | | 257/382 |
| 2007/0054481 A1* | 3/2007 | Chen et al. | | 438/581 |
| 2007/0096221 A1* | 5/2007 | Frohberg et al. | | 257/383 |
| 2007/0141836 A1* | 6/2007 | Yamauchi et al. | | 438/651 |
| 2007/0167009 A1* | 7/2007 | Chen et al. | | 438/682 |

OTHER PUBLICATIONS

R.L. Thornton, "Schottky-Barrier Elevation by Ion Implantation and Implant Segregation", Electronics Letters, vol. 17, No. 14, Jul. 9, 1981, pp. 485-486.

A. Kinoshita, et al., "Successful CMOS Operation of Dopant-Segregation Schottky-Barrier Transistors (DS-SBTs)", Extended Abstracts of the 2004 International Conference on Solid State Devices and Materials, Tokyo, A-5-1, 2004, pp. 172-173.

* cited by examiner

| PHASE | NiSi$_2$ | NiSi | Ni$_2$Si |
|---|---|---|---|
| CRYSTALLINE SYSTEM | CUBIC | ORTHOR-HOMBIC | ORTHOR-HOMBIC |
| CRYSTALLINE STRUCTURE | CaF$_2$ | MnP | PbCl$_2$ |
| LATTICE CONSTANT (Å) | 5.406 | a=5.18<br>b=3.34<br>c=5.62 | a=5.00<br>b=3.73<br>c=7.04 |
| COHESIVE ENERGY (eV/MOLECULE) | 14.74 | 10.03 | 15.02 |
| NON-RESISTANCE (ROOM TEMPERATURE) (10$^{-6}$ Ω cm) | 34 | 14 | 24 |

FIG. 29

IN CASE OF B

| | $E_f^{Int}$ (eV) | $E_f^{Si}$ (eV) | $E_f^{Ni}$ (eV) |
|---|---|---|---|
| Ni$_2$Si | 4.48 | 5.88 | 5.04 |
| NiSi | 3.79 | 4.61 | 4.22 |
| NiSi$_2$ | 2.54 | 4.59 | 3.78 |
| Si | 2.61 | 5.19 | |

IN CASE OF As

| | $E_f^{Int}$ (eV) | $E_f^{Si}$ (eV) | $E_f^{Ni}$ (eV) |
|---|---|---|---|
| Ni$_2$Si | -2.86 | 2.84 | 1.68 |
| NiSi | -2.42 | 2.22 | 0.052 |
| NiSi$_2$ | -2.10 | 1.95 | -1.06 |
| Si | -0.61 | 2.33 | |

FIG. 30

METHOD OF MANUFACTURING SILICIDE LAYER FOR SEMICONDUCTOR DEVICE

CROSS-REFERENCE TO RELATED APPLICATION

This application is based upon and claims the benefit of priority from prior Japanese Patent Application No. 2005-363813 filed on Dec. 16, 2005 in Japan, the entire contents of which are incorporated herein by reference.

BACKGROUND OF THE INVENTION

1. Field of the Invention

The present invention relates to a semiconductor device and a method of manufacturing the semiconductor device.

2. Related Art

The technology of producing silicon superintegrated circuits is one of the basic technologies that support the advanced information society in the future. To achieve high-performance integrated circuits, high-performance CMOS devices that are the components of those integrated circuits are essential. Although the scaling rule has been generally applied to high-performance devices, it is becoming difficult to produce higher-performance devices through ultra-miniaturization in recent years, due to various physical limits. One example, there is a problem of interface resistance in source and drain electrode regions.

A typical MOS transistor includes a gate insulating film that is formed on a silicon substrate, a gate electrode that is made of polysilicon formed on the gate insulating film, high-concentration impurity regions that are formed in portions of the silicon substrate located on both sides of the gate electrode and are to be source and drain regions, and extension regions that connect to the high-concentration impurity regions and are formed with an impurity region provided in a portion of the silicon substrate located below the gate electrode. Further, a silicide film is provided on the gate electrode and the high-concentration impurity regions.

The silicide film provided on the high-concentration impurity regions forms a Schottky junction between each high-concentration impurity region and each corresponding extension region. The resistance on the drain side is divided into the resistance of the silicide film ($R_{sh}$), the resistance of the drain region ($R_d$) caused by the bulk film, and the interface resistance of the Schottky junction ($R_c$). Among the three resistances, the interface resistance is generally known to be the highest. Since the interface resistance does not decrease according to the scaling rule, to reduce the interface resistance poses a very important problem in improving the performances of MOS transistors in the future.

Of the Schottky junctions formed between the silicide film and the high-concentration impurity regions, as to the Schottky junction on the drain side, electrons that have reached the high-concentration impurity region tunnel through the Schottky barrier height, towards the silicide film. The easiness of electron tunneling is generally referred to as the tunnel probability. The higher the tunnel probability is through a junction, the lower the interface resistance is. The tunnel probability is known to exponentially decrease in relation to the product of the Schottky barrier height and the tunnel distance. Therefore, the Schottky barrier height and the tunnel distance should be effectively reduced, so as to reduce the interface resistance.

One of the methods to do so involves segregating high-concentration activated impurities on the silicon side at the interface between the silicide film and the silicon film (see R. L. Thornton, Elec. Lett., 17, 485 (1981), and A. Kinoshita, SSDM, A-5-1 (2004), for example). Here, it is preferable to segregate the high-concentration activated impurities in a narrower range from the interface. Such an interface has the effect of improving the mirror effect and enhancing the bending of the silicon conduction band, so as to dramatically reduce the Schottky barrier height and the tunnel distance. However, such an interface has not yet been produced to this day.

The processing technique for forming a metal silicide on the gate electrode and the source and drain regions in a self-aligning fashion is called the SALICIDE (Self-aligned Silicide) process technique, which is an important technique for reducing the resistance in the gate electrode and the source and drain regions in a CMOS device.

Conventionally, disilicides such as $TiSi_2$ and $CoSi_2$ having low resistance among low-thermal metal silicides have been used for CMOS devices. However, in the trend of ultra-miniaturization of devices, the use of nickel monosilicide (NiSi) that has low sheet resistance and consumes less silicon (Si) in the silicidation process is expected for next-generation CMOS devices.

In the SALICIDE process, NiSi is considered to be beneficial, as it requires a lower processing temperature than the currently used $CoSi_2$. Generally, nickel silicide has many phases. The phase of nickel silicide that is formed at a lowest annealing temperature is dinickel silicide ($Ni_2Si$). As the annealing temperature rises, it changes to nickel monosilicide (NiSi), and to nickel disilicide ($NiSi_2$). According to the conventional nickel SALICIDE process, nickel monosilicide (NiSi) is formed at last, as it has the lowest resistance. More specifically, after a Ni film is formed on a silicon film, annealing is performed at 350° C. for 30 seconds, to form dinickel silicide ($Ni_2Si$). Annealing is then performed at 500° C. for 30 seconds, to change the dinickel silicide ($Ni_2Si$) into nickel monosilicide (NiSi).

To reduce the interface resistance at the interface between the nickel silicide film and the silicon film poses one of the most crucial problems with the nickel SALICIDE process that is expected to be put into practical use for next-generation CMOS devices by the scaling rule.

In a sample that is formed with two silicon films into which typical impurities, arsenic (As) and boron (B), are introduced, a silicide film is formed by the conventional nickel SALICIDE process, and the interface between the nickel monosilicide (NiSi) and the silicon (Si) film is observed through back-side SIMS (Secondary Ion Mass Spectroscopy). The results of the observation show that arsenic (As) is distributed on both sides of the interface, but most of boron (B) is distributed in the NiSi film. Therefore, a decrease in Schottky barrier height cannot be expected in the high-concentration impurity region (a p-type silicon layer) doped with boron (B). The results of actual experiments of current-voltage characteristics also show that an effective decrease in Schottky barrier height can hardly be seen.

SUMMARY OF THE INVENTION

The present invention has been made in view of the above circumstances, and an object thereof is to provide a semiconductor device that can reduce the interface resistance at the interface between the nickel silicide film and the silicon, and a method of manufacturing the semiconductor device.

A method of manufacturing a semiconductor device according to a first aspect of the present invention includes: forming an impurity region on a silicon substrate, with impurities being introduced into the impurity region; depositing a Ni layer so as to cover the impurity region; changing the surface of the impurity region into a $NiSi_2$ layer through annealing; forming a Ni layer on the $NiSi_2$ layer; and silicidating the $NiSi_2$ layer through annealing.

A semiconductor device according to a second aspect of the present invention includes: a MIS transistor which includes: a gate insulating film that is provided on a semiconductor region of a first conductivity type formed on a semiconductor substrate; a gate electrode that is provided on the gate insulating film; gate sidewalls that are provided on side portions of the gate electrode and are made of an insulating material; and a silicide laminated film that is provided on the opposite side of the semiconductor region from the gate electrode when seen from the gate sidewalls, the silicide laminated film including a $NiSi_2$ layer and a NiSi layer.

A semiconductor device according to a third aspect of the present invention includes: a p-type MIS transistor that comprises: a first gate insulating film that is provided on an n-type first semiconductor region formed on a semiconductor substrate; a first gate electrode that is provided on the first gate insulating film; first gate sidewalls that are provided on side portions of the first gate electrode and are made of an insulating material; a p-type impurity region that is provided on the opposite side of the first semiconductor region from the first gate electrode to the first gate sidewalls; and a first silicide laminated film that is provided on the p-type impurity region and includes a first $NiSi_2$ layer and a first NiSi layer; and an n-type MIS transistor that comprises: a second gate insulating film that is provided on a p-type second semiconductor region formed on the semiconductor substrate;

a second gate electrode that is provided on the second gate insulating film; second gate sidewalls that are provided on side portions of the second gate electrode and are made of an insulating material; an n-type impurity region that is provided on the opposite side of the second semiconductor region from the second gate electrode to the second gate sidewalls; and a second silicide laminated film that is provided on the n-type impurity region and includes a second $NiSi_2$ layer and a second NiSi layer.

BRIEF DESCRIPTION OF THE DRAWINGS

FIG. 29 is a diagram showing the characteristics of a surface phase of nickel silicide;

FIG. 30 is a diagram showing the formation energy in a case where B and As are introduced into each phase of nickel silicide and silicon film.

DETAILED DESCRIPTION OF THE INVENTION

First, the background to the present invention is described, before the embodiments of the present invention are described.

Figure 25:
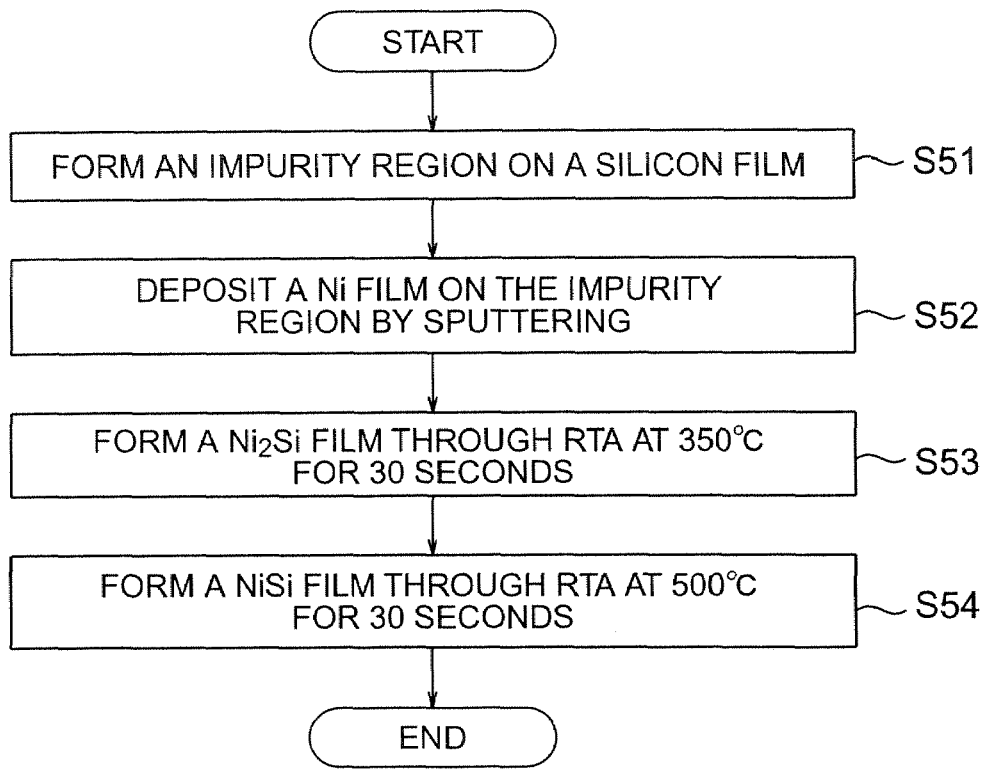
FIG. 25 is a flowchart showing a conventional nickel silicide process.
Figure 26A:
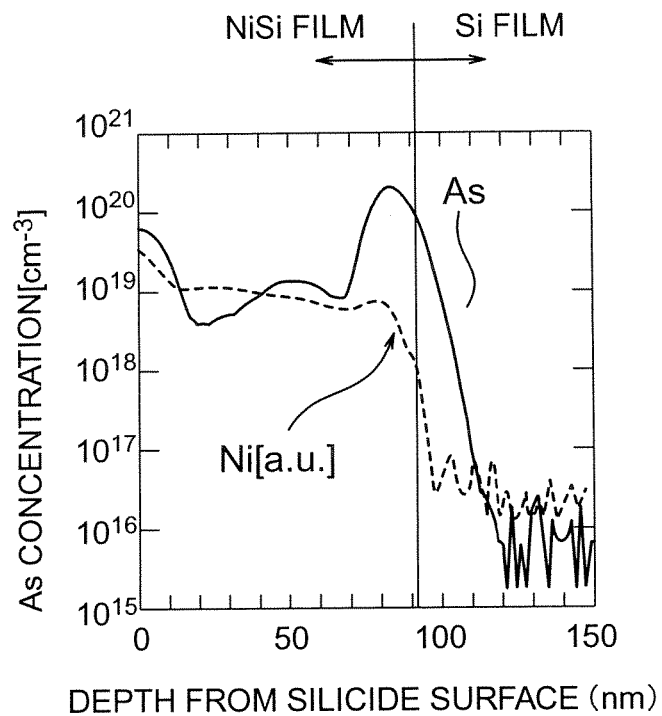
FIGS. 26A and 26B are diagrams showing the results of measurement carried out through back-side SIMS on the arsenic and boron distribution in the vicinity of the interface between the NiSi film and the silicon film formed by the conventional nickel silicide process.
Figure 26B:
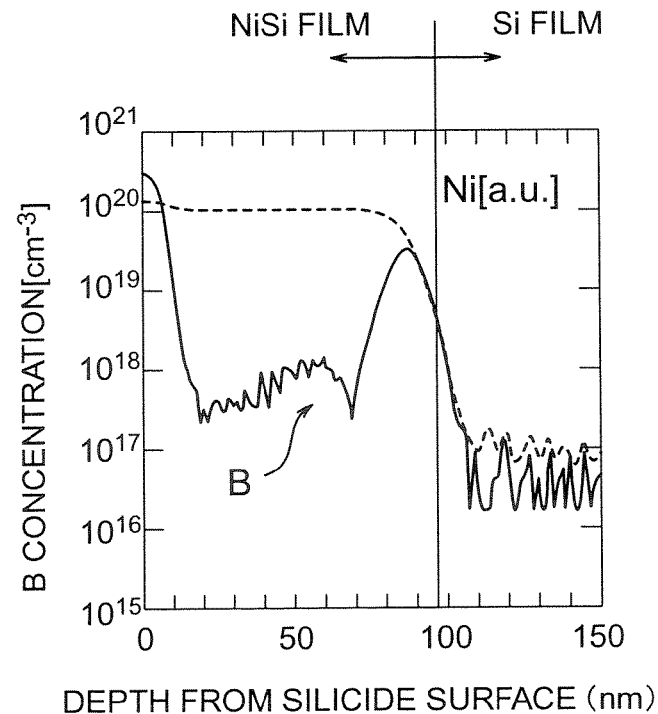

FIGS. 26A and 26B shows the results of observations made through back-side SIMS about the interface between NiSi and silicon films formed by a conventional nickel silicide process shown in FIG. 25. As shown in FIG. 25, in the conventional nickel silicide process, impurities are first introduced into a silicon film to form an impurity region (step S51). A Ni film is then deposited on the impurity region by a sputtering technique or the like (step S52). RTA (Rapid Thermal Annealing) is performed at 350° C. for 30 seconds, to form $Ni_2Si$ (step S53). RTA is then performed at 500° C. for 30 seconds, to form NiSi (step S54).

FIGS. 26A and 26B show the results of observations in cases where arsenic (As) and boron (B) are introduced as impurities into the impurity region of the silicon film. The region in which the nickel distribution decreases is equivalent to the interface between the silicon film and the NiSi film. When the interface does not rapidly change, the interface has surface roughness, and the impurity distribution averaged in the transverse direction is caught by the back-side SIMS. Accordingly, the mid point of the region in which the nickel concentration decreases can be regarded as the interface.

Figure 27:
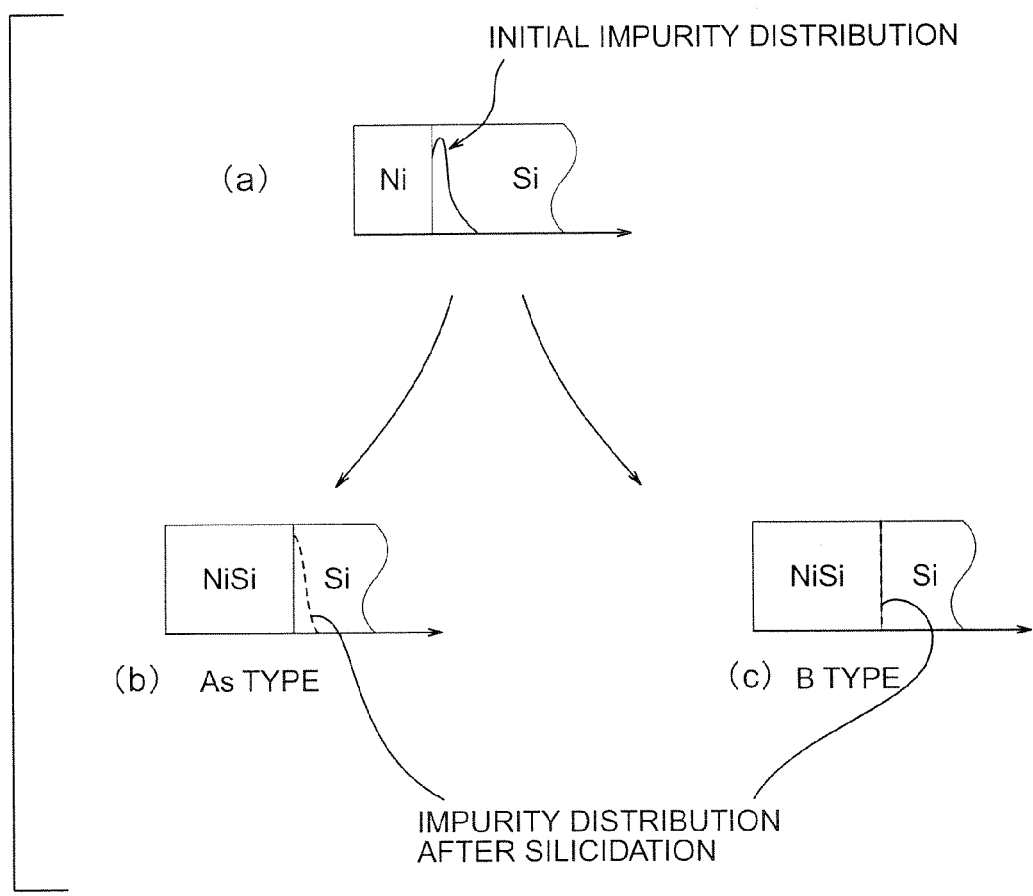
FIGS. 27(a), 27(b) and 27(c) are diagrams schematically showing the impurity distribution in the vicinity of the interface between the NiSi film and the silicon formed by the conventional nickel silicide process.
Figure 28:
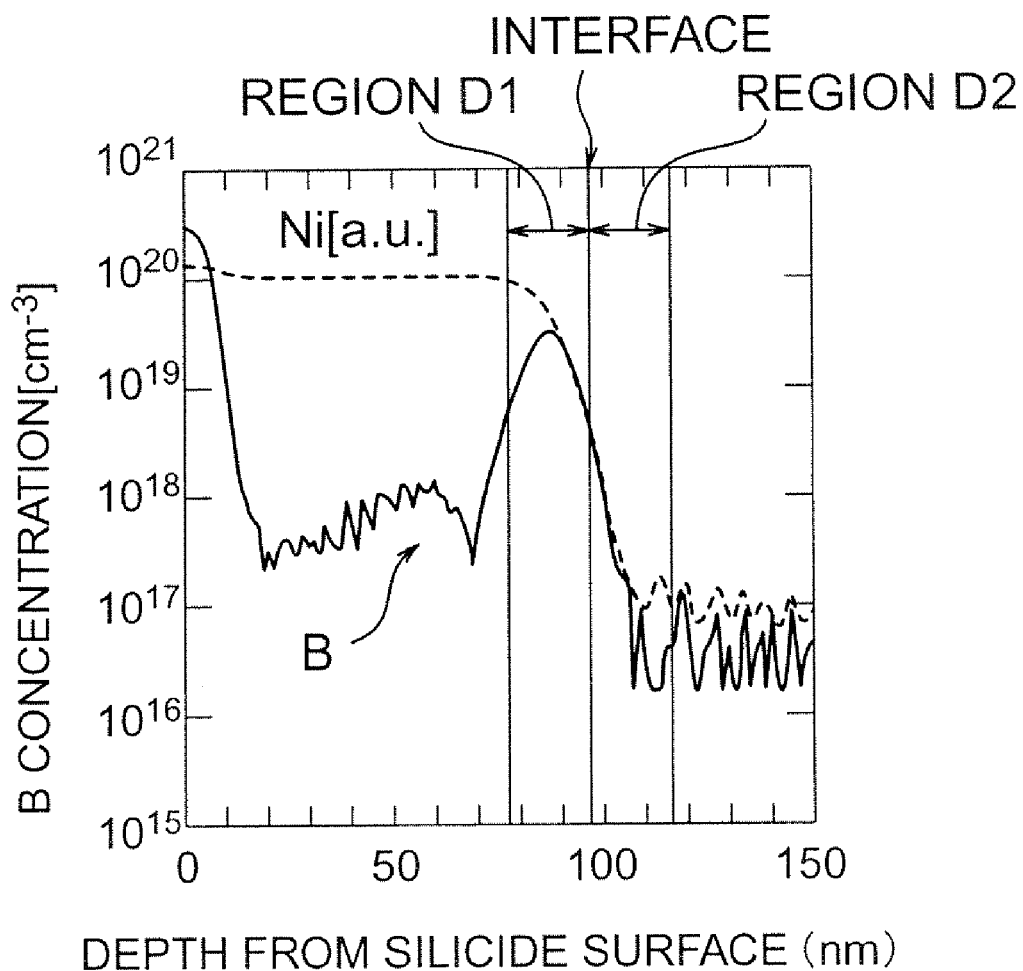
FIG. 28 is a diagram explaining the results of measurement carried out through back-side SIMS on the boron distribution in the vicinity of the interface between the NiSi film and the silicon film formed by the conventional nickel silicide process.

In the case where the conventional nickel silicide process is employed, As is distributed on both sides of the interface, as shown in FIG. 26A. Meanwhile, almost all of B is distributed in the NiSi film, as shown in FIG. 26B. As shown in FIG. 27($a$), the impurities exist also in the silicon film immediately after the Ni film is deposited on the silicon film (prior to the silicide formation). However, after the silicide formation, the impurities exist on both sides of the interface in the case where the impurities are As, as shown in FIG. 27($b$). In the case where the impurities are B type, most of the impurities exist in the NiSi film, as shown in FIG. 27($c$). FIG. 28 shows the results of measurement actually carried out through backside SIMS on the B distribution in the vicinity of the interface between the NiSi and Si films. As described above, the region in which the nickel concentration decreases is equivalent to the interface. With the mid point of the region in which the nickel concentration changes being the interface, the range of 20 nm on both sides are defined as a region D1 and a region D2, respectively. As the B concentration is integrated in between, the B concentration is $4.2 \times 10^{13}$ cm$^{-2}$ in the region D1, and is $7.92 \times 10^{12}$ cm$^{-2}$ in the region D2. As can be seen from the results, the amount of B contained in the NiSi film is the larger.

The inventors examined the reason that the impurity distributions at the interface between the NiSi film and the Si film formed by the conventional process become as shown in FIGS. 26A and 26B, by using first-principles calculation method.

The first-principles calculation method, including SP-GGA (Spin-Polarized Generalized Gradient Approximation) was used in this calculation. FIG. 29 shows the crystal structural data for nickel silicides that were actually used in the calculations. The formation energy with an impurity in a unit cell containing 12 atoms, 8 atoms, and 12 atoms for the nickel silicide phases $Ni_2Si$, NiSi, and $NiSi_2$, respectively, was calculated. As for silicon (Si), the same calculation was performed for a unit cell containing 64 atoms, and comparison with each nickel silicide phase was performed. The formation energy in the case where an impurity atom is introduced into nickel silicide and silicon unit cells is defined as follows:

1) Formation energies in a case where impurities are introduced into the silicon unit cell The formation energy with an impurity atom in the interstice can be expressed as:

$E_f^{Int}$=−E (a cell structure of 64 Si atoms containing one impurity atom)

+E (a cell structure of 64 Si atoms)+E (one impurity atom in vacuum)

In a case where one impurity atom is substituted with one Si atom, the formation energy can be expressed as:

$E_f^{Si}$=−E (a cell structure of 63 Si atoms containing one impurity atom)−E (one bulk silicon atom)

+E (a cell structure of 64 Si atoms)+E (one impurity atom in vacuum)

However, in the substitutional case, the substituted silicon atoms are assumed to move into the bulk silicon layer. For convenience, the formation energy in the case where one impurity atom is substituted with one silicon atom is represented by $E_f^{Si}$, and the formation energy in the case where one impurity atom is substituted with one nickel atom is represented by $E_f^{Ni}$.

2) Formation energy in a case where impurities are introduced into $Ni_2Si$

In a case where impurity atoms are introduced between the $Ni_2Si$ lattices, the formation energy can be expressed as:

$E_f^{Int}$=−E (a cell structure of 4 $Ni_2Si$ atoms containing one impurity atom)

+E (a cell structure of 4 $Ni_2Si$ atoms)+E (one impurity atom in vacuum)

In a case where one impurity atom is substituted with one Si atom, the formation energy can be expressed as:

$E_f^{Si}$=−E (a cell structure having one Si atom among the four $Ni_2Si$ atoms substituted with one impurity atom)

−E (one Si atom in the bulk)+E (a cell structure of 4 $Ni_2Si$ atoms)+E (one impurity atom in vacuum)

In a case where one impurity atom is substituted with one Ni atom, the formation energy can be expressed as:

$E_f^{Ni}$=−E (a cell structure having one Ni atom among the four $Ni_2Si$ atoms substituted with one impurity atom)

+(½) E (one $Ni_2Si$ atom)+E (one impurity atom in vacuum)+(½) E (one bulk Si atom)

However, in the case where an impurity atom is substituted with a Ni atom, the substituted Ni atoms were considered to combine with one bulk silicon atom into $Ni_2Si$. Based on the above observations, the formation energy was calculated according to the above equations.

3) Formation energy in a case where impurities are introduced into NiSi unit cell As in the case where impurity atoms are introduced into $Ni_2Si$ unit cell, in a case where impurity atoms are introduced between the NiSi lattices, the formation energy can be expressed as:

$E_f^{Int}$=−E (a cell structure of 4 NiSi atoms containing one impurity atom)

+E (a cell structure of 4 NiSi atoms)+E (one impurity atom in vacuum)

In a case where one impurity atom is substituted with one Si atom, the formation energy can be expressed as:

$E_f^{Si}$=−E (a cell structure having one Si atom among the four NiSi atoms substituted with one impurity atom)

−E (one bulk silicon atom)+E (a cell structure of 4 NiSi atoms)+E (one impurity atom in vacuum)

In a case where one impurity atom is substituted with one Ni atom, the formation energy can be expressed as:

$E_f^{Ni} = -E$ (a cell structure having one Ni atom among the four NiSi atoms substituted with one impurity atom)+(one NiSi atom)

+3E (one impurity atom in vacuum)+E (one bulk silicon atom)

4) Formation energy in a case where impurities are introduced into NiSi$_2$

As in the case where impurity atoms are introduced into Ni$_2$Si or NiSi unit cells, in a case where impurity atoms are introduced between the NiSi$_2$ unit cells, the formation energy can be expressed as:

$E_f^{Int} = -E$ (a cell structure of 4 NiSi$_2$ atoms containing one impurity atom)

+E (a cell structure of 4 NiSi$_2$ atoms)+E (one impurity atom in vacuum)

In a case where one impurity atom is substituted with one Si atom, the formation energy can be expressed as:

$E_f^{Si} = -E$ (a cell structure having one Si atom among the four NiSi$_2$ atoms substituted with one impurity atom)

−E (one bulk silicon atom)+E (a cell structure of 4 NiSi$_2$ atoms)+E (one impurity atom in vacuum)

In a case where one impurity atom is substituted with one Ni atom, the formation energy can be expressed as:

$E_f^{Ni} = -E$ (a cell structure having one Ni atom among the four NiSi$_2$ atoms substituted with one impurity atom)

+3E (one NiSi$_2$ atom)+E (one impurity atom in vacuum)+2E (one bulk silicon atom)

FIG. 30 shows the results of calculations of formation energy. In general, the formation energy represents the difference between the initial state of reaction and the final state of the reaction. A state having larger formation energy is considered to be easier to be realized in an actual system. For example, as can be seen from the calculation result in the case where boron (B) enters the silicon interstitial site, $E_f^{Si}$ is larger than $E_f^{Int}$, and accordingly, boron atoms easily enter the silicon substitution site. In the case of arsenic (As), $E_f^{Int}$ becomes a negative value, and As atoms cannot enter the interstitial site but most As atoms enter the Si substitution site in the final state.

Next, comparisons between the formation energy in a case where impurities enter the interstitial site of each phase of nickel silicide and the formation energy in a case where impurities enter the silicon interstitial site are described. In the conventional nickel SALICIDE process shown in FIG. 25, Ni$_2$Si is generated in the first annealing procedure. The formation energy in the case where B atoms enter the Ni$_2$Si unit cells is larger than the formation energy in the case where B atoms enter the Si unit cells, whether the B atoms enter the Si substitution site or the interstitial site. Therefore, B atoms are considered to remain in the Ni$_2$Si layer during the silicidation procedure.

Furthermore, even after NiSi is generated in the second annealing procedure (step S54) shown in FIG. 25, the formation energy in the interstice case is clearly larger than that in the case of silicon layer but the difference of formation energy in the case of entering the Si substitutional site is very small between the NiSi and Si layers. Based on this fact, B atoms can be considered to segregate toward the NiSi film at the interface between the NiSi film and the Si film during the silicidation procedure.

As for the case of As, the formation energy at the time of entering the Si substitution site in the case where the As atoms are introduced between Si unit cells is substantially equal to the formation energy in either case of Ni$_2$Si unit cells or NiSi unit cells. Therefore, the As atoms can be considered to segregate to both sides.

The same calculation as above was also performed for the NiSi$_2$ lattices generated through high-temperature annealing (750° C. or higher). The results show that the formation energy in either case where impurities (As or B) enter the interstitial site or the Si substitutional site is smaller than in the case of Si layers. Accordingly, once annealing is performed at such a temperature as to generate NiSi$_2$, impurity atoms can be segregated on the Si side at the interface, and the effect of reducing the interface resistance can be expected.

However, the NiSi$_2$ film has high resistivity than the NiSi film, as shown in FIG. 29. Therefore, the generated NiSi$_2$ needs to be turned back into NiSi.

In view of the above facts, the inventors considered that a Ni film should be formed on the NiSi$_2$ film by a sputtering technique, followed by annealing at 500° C. or lower to scatter the Ni atoms in the NiSi$_2$ film. By doing so, the reaction of Ni+NiSi$_2$→2NiSi occurs, and a NiSi film is formed.

Embodiments of the present invention are as follows.

First Embodiment

Figure 1:
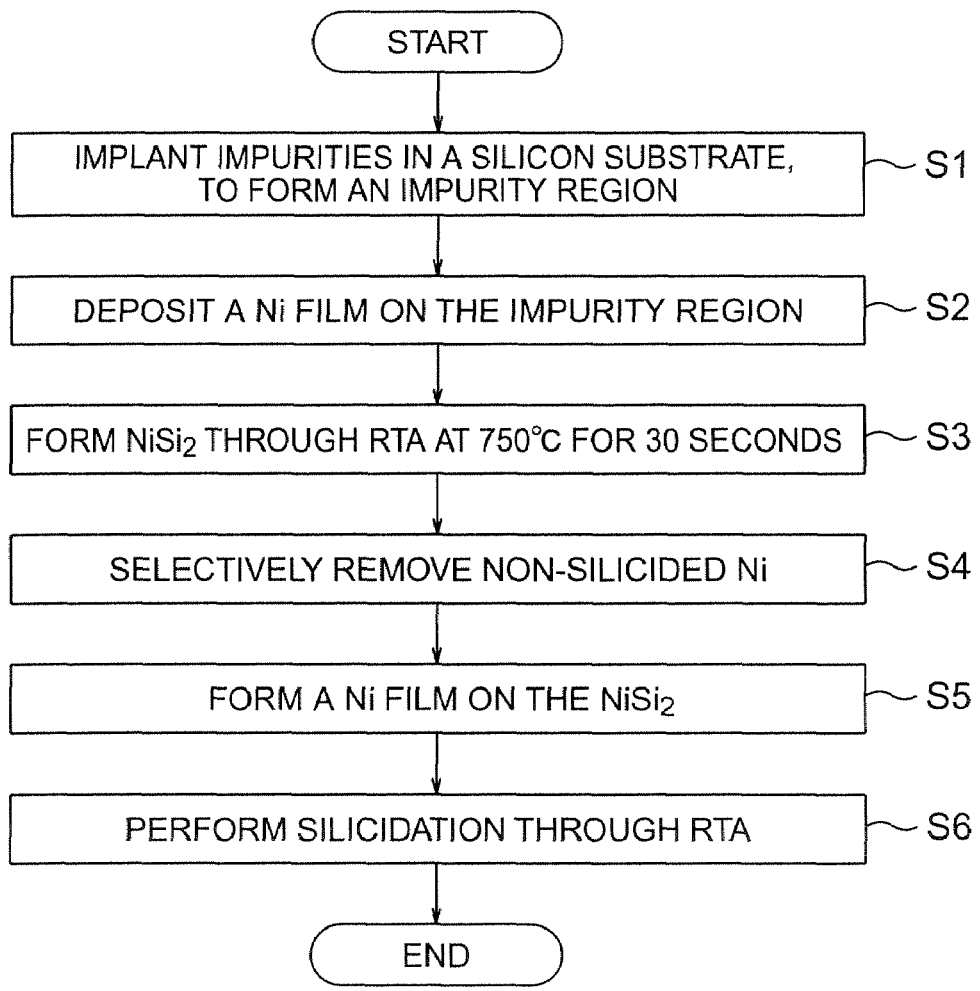
FIG. 1 is a flowchart showing a method of manufacturing a semiconductor device according to a first embodiment of the present invention.
Figure 2:
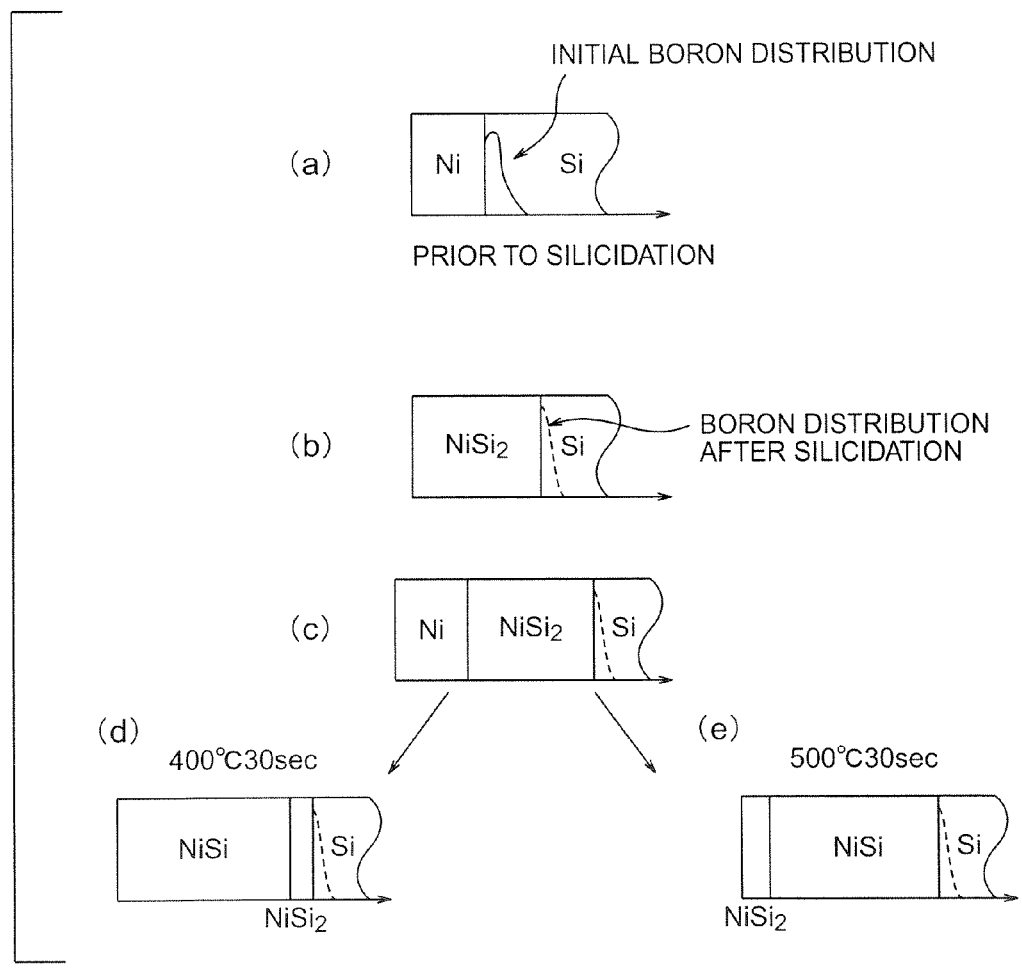
FIGS. 2(a) to 2(e) are cross-sectional views illustrating the steps in the manufacturing method according to the first embodiment.

Referring now to FIGS. 1 to 2(e), a method of manufacturing a semiconductor device according to a first embodiment of the present invention is described. FIG. 1 is a flowchart showing the procedures in the manufacturing method according to this embodiment. FIGS. 2(a) to 2(e) are schematic cross-sectional views showing the steps in the manufacturing method according to this embodiment.

First, as shown in step S1 of FIG. 1, impurities (such as boron (B)) are implanted in a silicon substrate, to form an impurity region. A Ni film is then deposited on the impurity region by a sputtering technique or the like (step S2 of FIG. 1; see FIG. 2(a)). RTA is performed at 750° C. for 30 seconds, to form a NiSi$_2$ film (step S3 of FIG. 1; see FIG. 2(b)). The Ni that is not silicided is then removed with SH (a mixture of sulfuric acid and hydrogen peroxide solution) (step S4 of FIG. 1). Next, Ni is again deposited on the NiSi$_2$ film by a sputtering technique, for example (step S5 of FIG. 1; see FIG. 2(c)). RTA is then performed to silicide the Ni (step S6 of FIG. 1).

If the annealing temperature in step S6 of FIG. 1 is high (higher than 400° C. but not higher than 500° C., for example), the Ni atom diffusion in the NiSi$_2$ film is accelerated. Accordingly, NiSi is generated from the interface between the NiSi$_2$ film and the Si substrate, and a NiSi film is formed between the NiSi$_2$ film and the Si substrate, as shown in FIG. 2E. If the annealing temperature is low (not higher than 400° C. for example), NiSi is generated on the opposite surface of the NiSi$_2$ film from the Si substrate, and a NiSi film is formed on the NiSi$_2$ film, as shown in FIG. 2(d).

Whether the annealing temperature is high or low, the resultant silicide layer is a laminated structure of a NiSi$_2$ film and a NiSi film. However, the thickness of the NiSi$_2$ film is very much smaller than the thickness of the NiSi film, and the resistance of the silicide layer is low accordingly. The impurities introduced into the silicon substrate exist also on the sides of the silicon substrate, as shown in FIGS. 2(a) to 2(e). This is reinforced by the evaluation result of the effective Schottky barrier height, as described later.

As described above, according to this embodiment, the interface resistance at the interface between the nickel silicide film and the silicon (the silicon substrate) can be reduced.

In this embodiment and the later described second embodiment, if the thickness of a Ni film deposited on the $NiSi_2$ film by a sputtering technique is larger than the thickness of the $NiSi_2$ film, the Ni atoms remaining after all the $NiSi_2$ has changed to NiSi diffuse into the Si substrate, and the impurities once removed from the Si substrate are returned into the Si substrate. Therefore, the thickness of the Ni film formed on the $NiSi_2$ film by a sputtering technique should preferably be smaller than the thickness of the $NiSi_2$ film.

Second Embodiment

Figure 3:
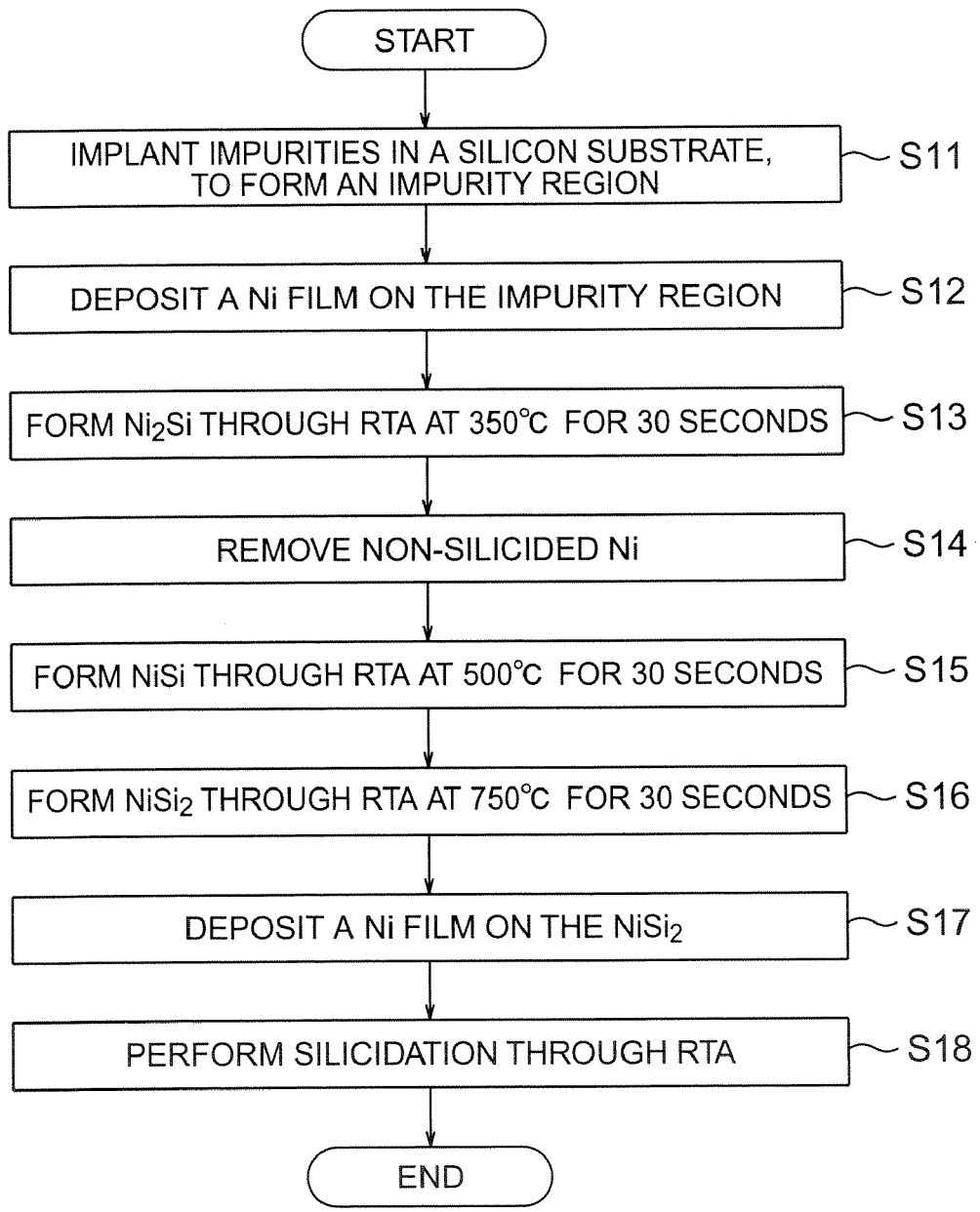
FIG. 3 is a flowchart showing a method of manufacturing a semiconductor device according to a second embodiment of the present invention.
Figure 4:
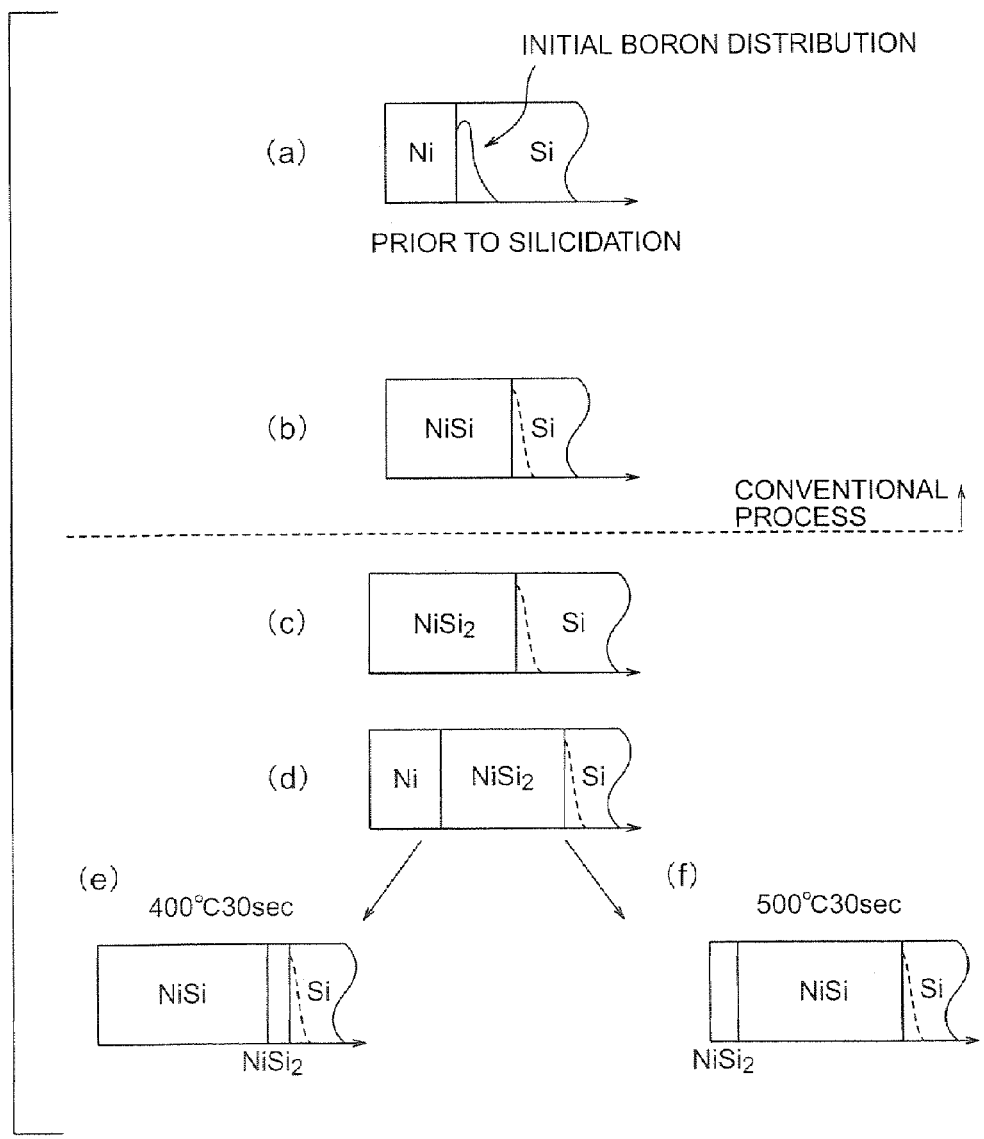
FIGS. 4(a) to 4(f) are cross-sectional views illustrating the steps in the manufacturing method according to the second embodiment.

Referring now to FIG. 3 to 4(f), a method of manufacturing a semiconductor device according to a second embodiment of the present invention is described. FIG. 3 is a flowchart showing the procedures in the manufacturing method according to this embodiment. FIGS. 4(a) to 4(f) are schematic cross-sectional views showing the steps in the manufacturing method according to this embodiment.

First, as shown in step S11 of FIG. 3, impurities (such as boron (B)) are implanted in a silicon substrate, to form an impurity region. A Ni film is then deposited on the impurity region by a sputtering technique or the like (step S12 of FIG. 3; see FIG. 4(a)). RTA is performed at 350° C. for 30 seconds, to form a $Ni_2Si$ film (step S13 of FIG. 3). The Ni that is not silicided is then removed with a known chemical solution (step S14 of FIG. 3). NiSi is then formed through RTA at 500° C. for 30 seconds (step S15 of FIG. 3; see FIG. 4(b)). The procedures up to this point are the same as the conventional nickel silicide process.

Next, $NiSi_2$ is formed through RTA at 750° C. for 30 seconds (step S16 of FIG. 3; see FIG. 4(c)). Ni is then deposited on the $NiSi_2$ film by a sputtering technique, for example (step S17 of FIG. 3; see FIG. 4(d)). RTA is then performed to silicide the Ni (step S18 of FIG. 3).

If the annealing temperature in step S18 of FIG. 3 is high (higher than 400° C. but not higher than 500° C., for example), the Ni atom diffusion in the $NiSi_2$ film is accelerated as mentioned in the description of the first embodiment. Accordingly, NiSi is generated from the interface between the $NiSi_2$ film and the Si substrate, and a NiSi film is formed between the $NiSi_2$ film and the Si substrate, as shown in FIG. 4(f). If the annealing temperature is low (not higher than 400° C. for example), NiSi is generated on the opposite surface of the $NiSi_2$ film from the Si substrate, and a NiSi film is formed on the $NiSi_2$ film, as shown in FIG. 4(e).

Whether the annealing temperature is high or low, the resultant silicide layer is a laminated structure of a $NiSi_2$ film and a NiSi film. However, the thickness of the $NiSi_2$ film is very much smaller than the thickness of the NiSi film, and the resistance of the silicide layer is low accordingly. The impurities introduced into the silicon substrate exist also on the sides of the silicon substrate, as shown in FIGS. 4(a) to 4(f).

As described above, according to this embodiment, the interface resistance at the interface between the nickel silicide film and the silicon (the silicon substrate) can be reduced, as in the first embodiment.

In the following, the embodiments of the present invention are described in greater detail by way of examples.

EXAMPLE 1

A semiconductor device of Example 1 of the present invention is now described. The semiconductor device of this example is a Schottky diode that is manufactured by the manufacturing method of the second embodiment shown in FIG. 3, and the annealing temperature at which each silicide film of a double-layer structure is formed is 400° C. Referring to FIGS. 5 to 10, a method of manufacturing the Schottky diode of this example is described.

Figure 5:
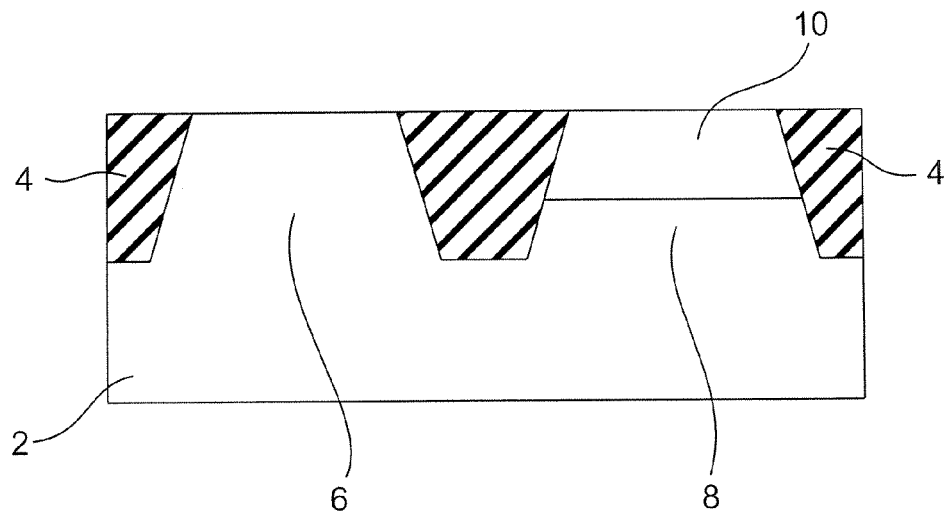
FIG. 5 is a cross-sectional view illustrating a step for manufacturing a semiconductor device of Example 1.

First, as shown in FIG. 5, trenches that isolate device regions 6 and 8 from each other are formed at 50 μm intervals on an n-type silicon substrate 2 doped with arsenic (As) with a concentration of $10^{15}$ cm$^{-3}$. These trenches are filled with insulating film, to form device isolating insulating films 4 each having a STI (Shallow Trench Isolation) structure. A high-concentration impurity region 10 doped with boron (B) with a concentration of $10^{20}$ cm$^{-3}$ is formed in the range of the substrate surface to 300 nm in depth in each device region 8. Annealing (spike annealing) is then performed to activate impurities at 1050° C.

Figure 6:
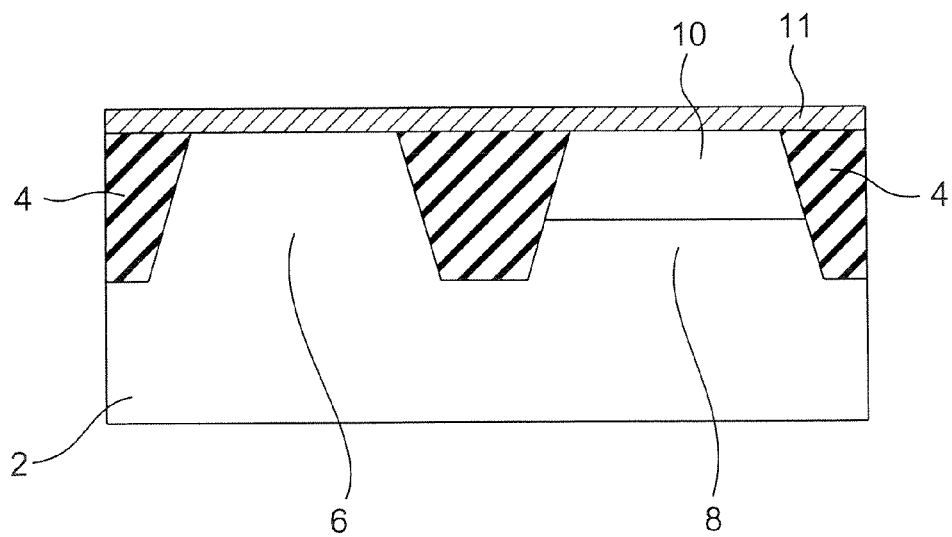
FIG. 6 is a cross-sectional view illustrating a step for manufacturing a semiconductor device of Example 1.
Figure 7:
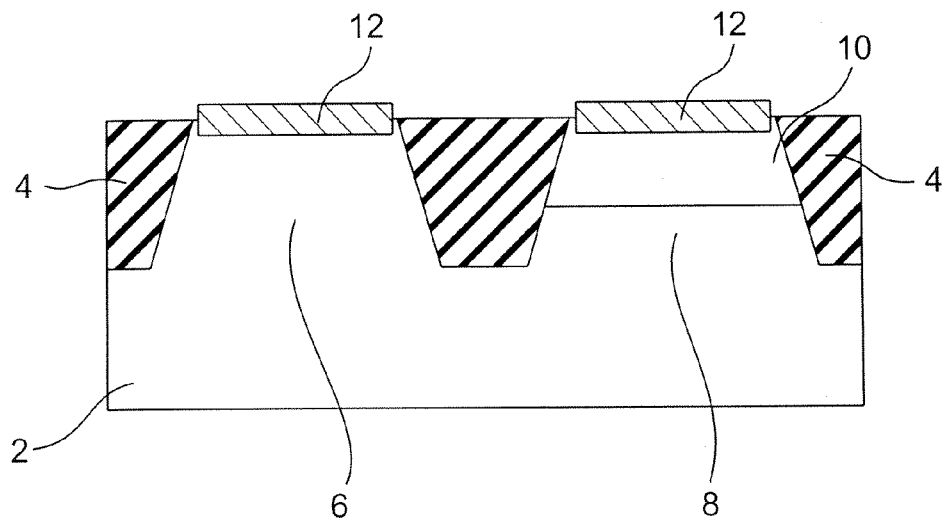
FIG. 7 is a cross-sectional view illustrating a step for manufacturing a semiconductor device of Example 1.

As shown in FIG. 6, a Ni film 11 of 12 nm in thickness is formed on the entire substrate surface by a sputtering technique. Annealing is then performed at 350° C. for 30 seconds, to form a $Ni_2Si$ film (not shown). After the Ni that is not silicided is selectively removed with a chemical solution, annealing is performed at 500° C. for 30 seconds, to form NiSi films 12 on the device regions 6 and 8, as shown in FIG. 7. The film thickness of each of the NiSi films 12 formed on the device regions 6 and 8 is 15 nm. The semiconductor device having the structure shown in FIG. 7 is the same as a Schottky diode manufactured by the conventional nickel silicide method.

Figure 8:
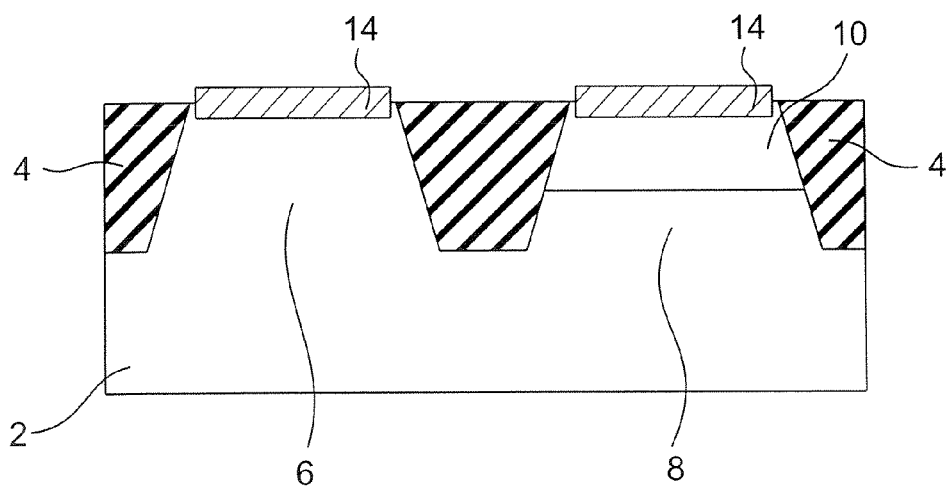
FIG. 8 is a cross-sectional view illustrating a step for manufacturing a semiconductor device of Example 1.
Figure 9:
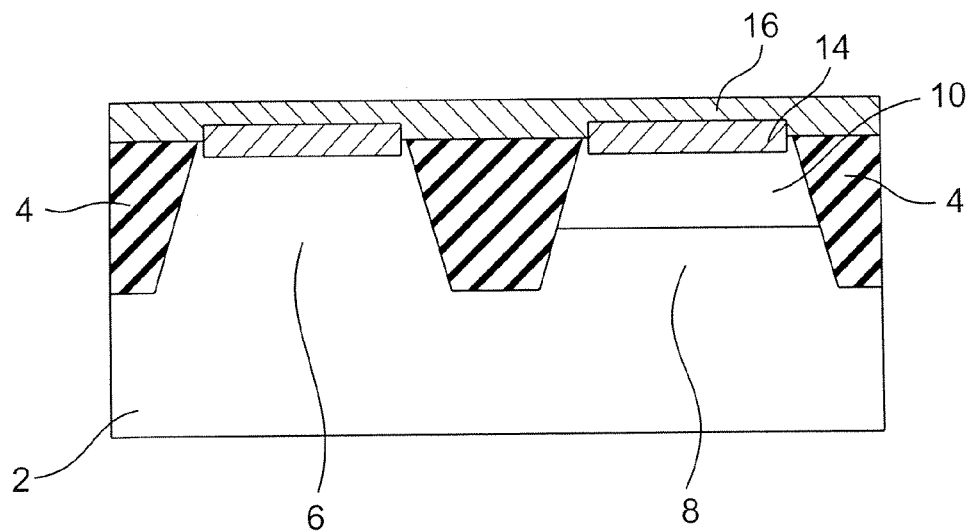
FIG. 9 is a cross-sectional view illustrating a step for manufacturing a semiconductor device of Example 1.
Figure 10:
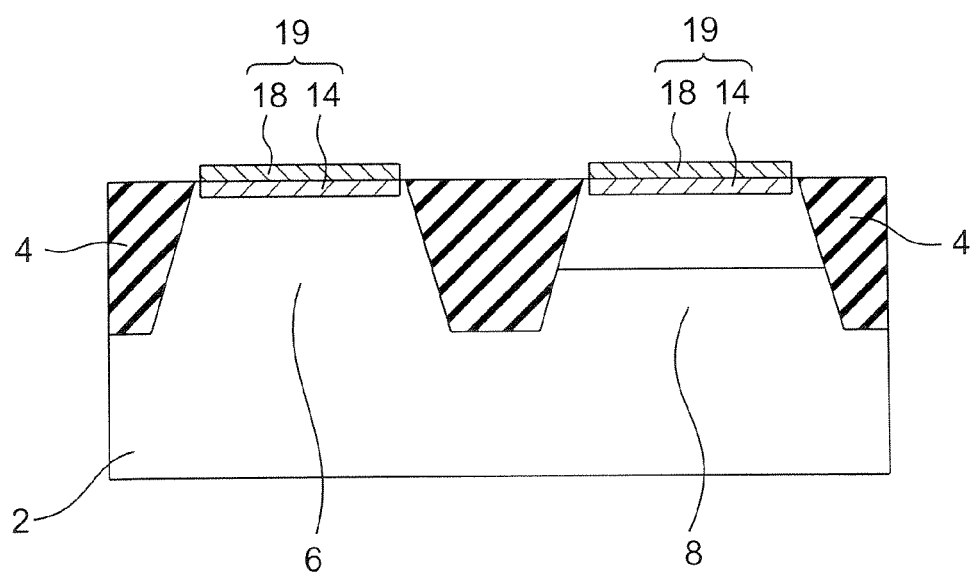
FIG. 10 is a cross-sectional view illustrating a step for manufacturing a semiconductor device of Example 1.

Further, annealing is performed at 750° C. for 30 seconds, to change the NiSi films 12 to $NiSi_2$ films 14, as shown in FIG. 8. At this point, the thickness of each of the $NiSi_2$ films 14 is substantially the same as the thickness of each of the NiSi films 12, which is 15 nm. A Ni film 16 of approximately 10 nm in thickness is then formed on the entire substrate surface by a sputtering technique, as shown in FIG. 9. After annealing is performed at 400° C. for 30 seconds, the Ni that is not silicided is selectively removed with a chemical solution, so as to form nickel silicide laminated films 19 on the device regions 6 and 8, as shown in FIG. 10. Each of the nickel silicide laminated films 19 has the $NiSi_2$ film 14 as the lower layer (on the side of the silicon substrate) and a NiSi film 18 as the upper layer. The Schottky diode shown in FIG. 10 will be hereinafter referred to as the Schottky diode of Example 1.

EXAMPLE 2

A semiconductor device of Example 2 of the present invention is now described. The semiconductor device of this example is a Schottky diode that is manufactured by the manufacturing method of the second embodiment shown in FIG. 3. This example is the same as Example 1, except that the annealing temperature at which each silicide film of a double-layer structure is formed is 500° C. More specifically, the semiconductor device of this example is manufactured in the same manner as in Example 1 until the procedures shown in FIG. 9. Annealing is then performed at 500° C. for 30 seconds, and the Ni that is not silicided is selectively removed with a chemical solution, thereby completing the Schottky diode of Example 2. Unlike in Example 1, each of the silicide laminated film in the Schottky diode of this example has a NiSi film as the lower layer (on the side of the silicon substrate) and a $NiSi_2$ film as the upper layer.

EXAMPLE 3

A Schottky diode of Example 3 of the present invention is now described. The Schottky diode of this example is manufactured in the same manner as in Example 1, until the procedure shown in FIG. 8. The thickness of the Ni film 16 deposited by a sputtering technique after the procedure shown in FIG. 8 is 20 nm, which is different from the thickness of the Ni film 16 in Example 1. Accordingly, the thickness (=20 nm) of the Ni film 16 is larger than the thickness (=15 nm) of each $NiSi_2$ film 14, unlike the case in Example 1. After the Ni film 16 is deposited, annealing is performed at 400° C. for 30 seconds, as in Example 1. The Ni that is not silicided is selectively removed with a chemical solution, thereby completing the Schottky diode of Example 3.

In the Schottky diode of this example, the thickness (=20 nm) of the Ni film 16 is larger than the thickness (=15 nm) of each $NiSi_2$ film 14. Accordingly, all the $NiSi_2$ films 14 turn into the NiSi films 18, and each silicide film has a single-layer structure of a NiSi film.

COMPARATIVE EXAMPLE 1

The Schottky diode manufactured in the same manner as the Schottky diode of Example 1 until the procedure shown in FIG. 7 (the Schottky diode shown in FIG. 7) is set as Comparative Example 1 with respect to Example 1 to Example 3. In other words, the Schottky diode of Comparative Example 1 is manufactured by the conventional nickel silicide process.

COMPARISONS AMONG THE EFFECTIVE SCHOTTKY BARRIER HEIGHTS OF THE SCHOTTKY DIODES OF EXAMPLE 1, EXAMPLE 2, AND COMPARATIVE EXAMPLE 1

In the following, comparisons among the effective Schottky barrier heights of the Schottky diodes of Example 1, Example 2, and Comparative Example 1 are described.

Figure 11:
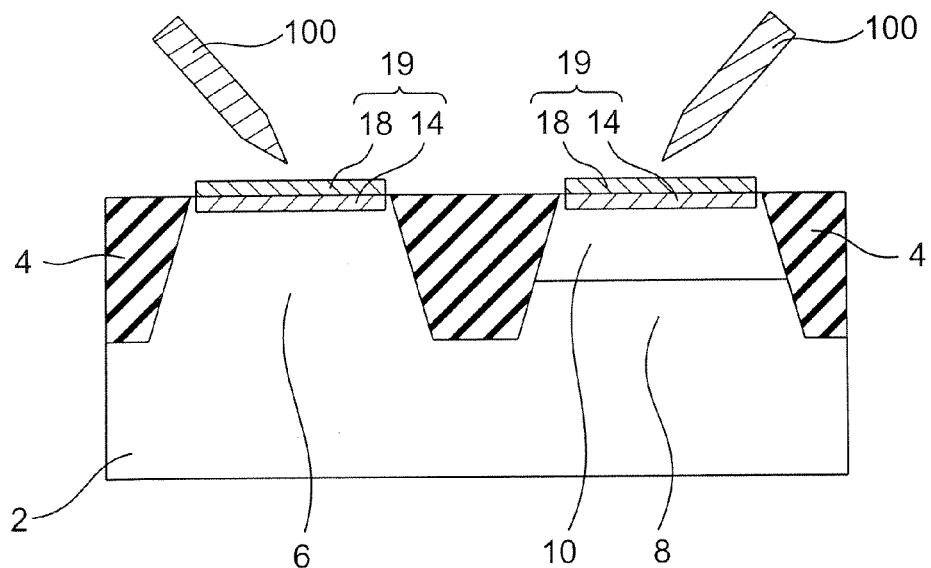
FIG. 11 is a diagram for explaining the method of evaluating the Schottky barrier height at the interface between the nickel silicide laminated film and the silicon film of each of the Schottky diodes of Example 1 and Example 2.

As shown in FIG. 11, a terminal 100 was brought into contact with each Schottky diode, so as to measure the current-voltage characteristics of this diode. Based on the voltage with which a current rises, the effective Schottky barrier height at the interface between each nickel silicide laminated film and the silicon substrate was evaluated. The measurement results showed that the effective Schottky barrier height for a hole was 0.3 eV in the Schottky diode of Comparative Example 1, 0.1 eV in the Schottky diode of Example 1, and 0.14 eV in the Schottky diode of Example 2. As can be seen from these results, the effective Schottky barrier height at the interface between each nickel silicide laminated layer and the silicon substrate in each of the Schottky diodes of Example 1 and Example 2 manufactured by the nickel silicide process according to the second embodiment shown in FIGS. 3 to 4(f) is smaller than the effective Schottky barrier height in the Schottky diode manufactured by the conventional nickel silicide process shown in FIG. 25 (Comparative Example 1). This proves that the semiconductor device manufacturing method according to the second embodiment has the effect of reducing the interface resistance at the interface between the nickel silicide film and the silicon substrate.

COMPARISON BETWEEN THE INTERFACE STRUCTURES OF EXAMPLE 1 AND EXAMPLE 2

Next, the interface between each nickel silicide laminated film and the silicon substrate of each of the Schottky diodes of Example 1 and Example 2 was observed through XRD (X-Ray Diffraction) and TEM-EDX (Transmission Electron Microscopy—Energy Dispersive X-Ray Spectrometer). The results showed that the interface between each nickel silicide laminated film and the silicon substrate in Example 1 had the structure of NiSi film (18 nm)/$NiSi_2$ film (4 nm)/Si, while the interface in Example 2 had the structure of $NiSi_2$ film (4 nm)/NiSi film (18 nm)/Si. With the $NiSi_2$ film being formed on the surface, the impurities in the nickel silicide laminated films can segregate on the Si side at the interface. Accordingly, the bending of the conduction band of the Si substrate becomes larger to reduce the effective Schottky barrier height.

However, in either Example 1 or Example 2, the effective Schottky barrier height is smaller than that at the Schottky interface formed by the conventional nickel SALICIDE process, and it is confirmed that an excellent interface with lower resistance can be produced.

Figure 31:
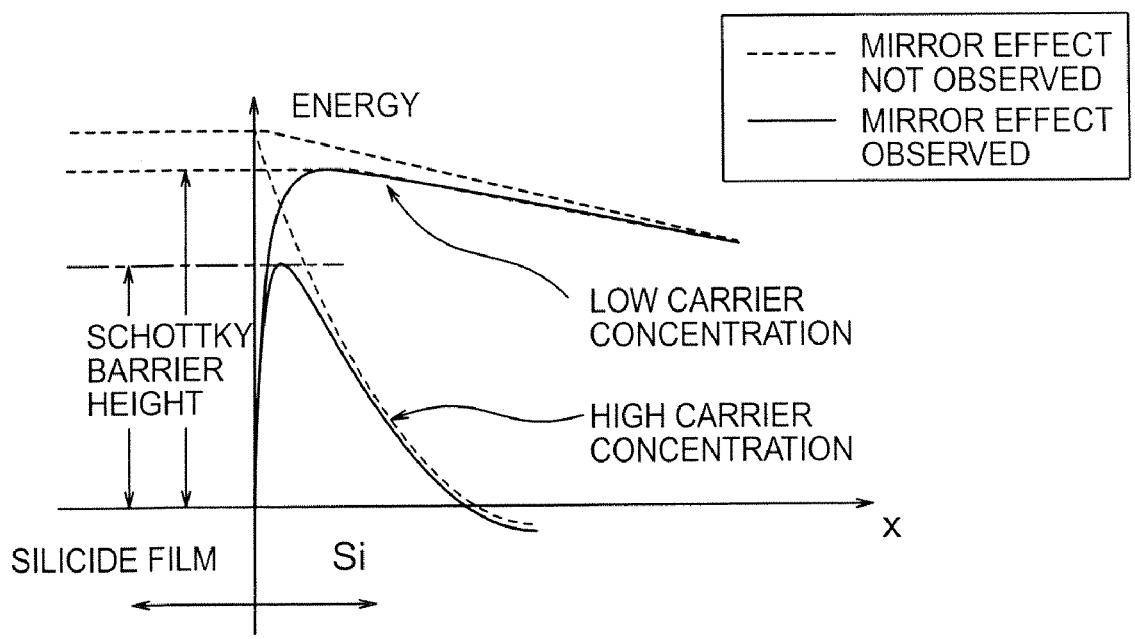
FIG. 31 is a diagram showing the difference in bending of the conduction band between silicon films due to the difference in dopant amount between the silicon films (silicon substrates).

Further, the region in the vicinity of the interface between each nickel silicide laminated film and the silicon substrate in the Schottky diode of Example 1, which is the range of 20 nm from the interface, was observed through back-side SIMS. The results showed that, unlike the case of a conventional art shown in FIG. 28, a large amount of B atoms existed on the side of the silicon substrate. Accordingly, the mirror effect and the bending of the conduction band on the side of the silicon substrate become larger than in the conventional case, as shown in FIG. 31, and the effective Schottky barrier height is reduced.

MEASUREMENT OF THE CURRENT-VOLTAGE CHARACTERISTICS OF THE SCHOTTKY DIODE OF EXAMPLE 3

In the Schottky diode of Example 3, all of the $NiSi_2$ film at the interface turns into a NiSi film. Therefore, the B atoms released from the $NiSi_2$ film are partially returned to the reformed NiSi film, to reduce the bending of the conduction band in the Si layer. Accordingly, the measurement results show that the effective Schottky barrier height in Example 3 is larger than the effective Schottky barrier height in either of the Schottky diodes of Example 1 and Example 2. Because of this fact, the Ni film to be formed by a sputtering technique should preferably be made thinner than the $NiSi_2$ film.

EXAMPLE 4

A Schottky diode of Example 4 of the present invention was produced. The Schottky diode of Example 4 was formed on a p-type silicon substrate doped with boron (B) with a concentration of $10^{15}$ $cm^{-3}$ through substantially the same procedures as the procedures in the method of manufacturing the Schottky diode of Example 1 shown in FIGS. 5 to 10, except that the high-concentration impurity region 10 is doped with As with a concentration of $10^{20}$ $cm^{-3}$.

COMPARATIVE EXAMPLE 2

For comparison with the Schottky diode of Example 4, a Schottky diode of Comparative Example 2 having the structure shown in FIG. 7 was produced by the conventional nickel silicide process shown in FIG. 25. Like the Schottky diode of Example 4, the Schottky diode of Comparative Example 2 has the high-concentration impurity region 10 doped with As with a concentration of $10^{20}$ $cm^{-3}$.

COMPARISON BETWEEN THE EFFECTIVE SCHOTTKY BARRIER HEIGHT OF COMPARATIVE EXAMPLE 2 AND EXAMPLE 4

As shown in FIG. 11, a terminal 100 was brought into contact with each Schottky diode, so as to measure the current and voltage between the nickel silicide laminated films. Based on the voltage with which a current rises, the effective Schottky barrier height at the interface between each nickel silicide laminated film and the silicon substrate was evaluated. The evaluation results showed that the effective Schottky barrier height with respect to electrons in the Schottky diode of Example 4 is much smaller than that in the Schottky diode of Comparative Example 2.

EXAMPLE 5

Next, a method of manufacturing an n-type MIS transistor in Example 5 of the present invention is described.

Figure 12:
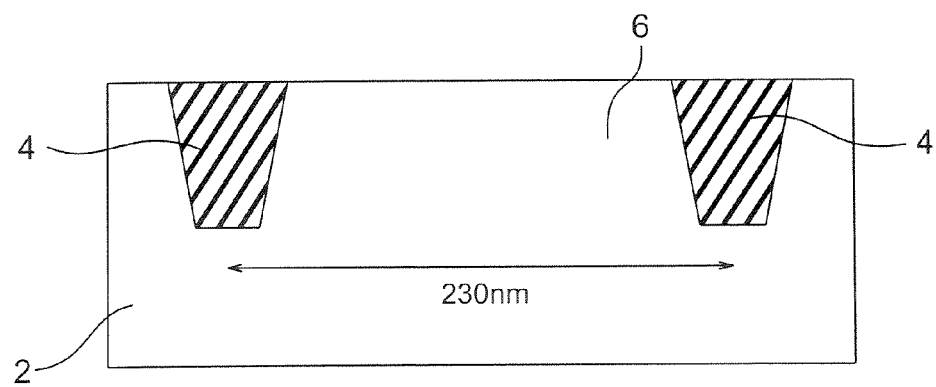
FIG. 12 is a cross-sectional view illustrating a step for manufacturing a MIS transistor of Example 5.

First, as shown in FIG. 12, trenches that isolate device regions 6 from each other are formed at 230 nm intervals on a p-type silicon substrate 2 doped with boron (B) with a concentration of $10^{15}$ cm$^{-3}$. These trenches are filled with insulating film, to form device isolating insulating films 4 each having a STI structure.

Figure 13:
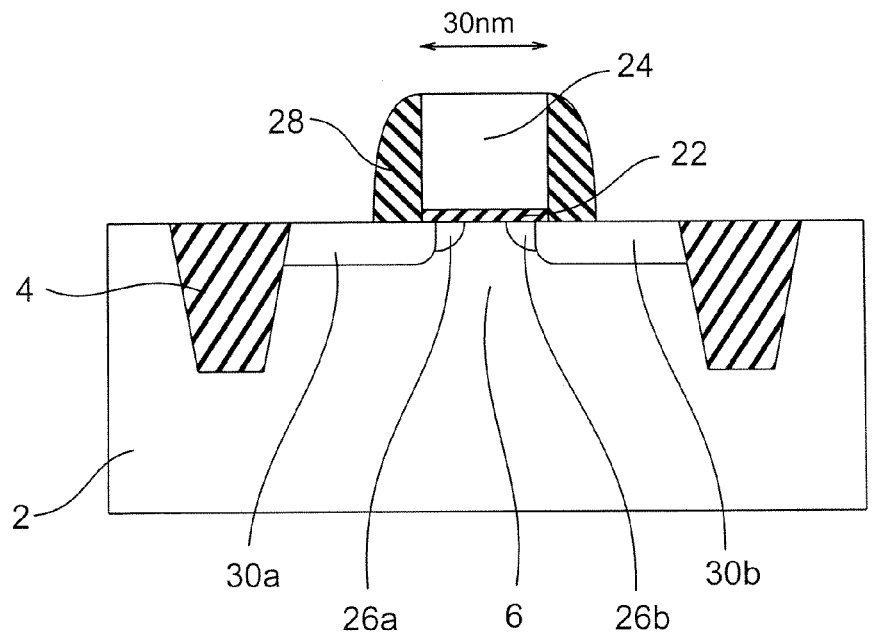
FIG. 13 is a cross-sectional view illustrating a step for manufacturing a MIS transistor of Example 5.

By a known technique, a device structure shown in FIG. 13 is then formed in the device regions 6 isolated from one another by the device isolating insulating films 4. This device structure is formed in the following manner. A gate insulating film 22 having an equivalent oxide thickness (EOT) of 1 nm and a gate width of 30 nm is formed on each device region 6, and a gate electrode 24 is then formed on the gate insulating film 22. Extension regions 26a and 26b doped with As with a concentration of $10^{20}$ cm$^{-3}$ are formed on both sides of the gate electrode 24 in each device region 6. Gate sidewalls 28 made of an insulating material are formed on the side portions of the gate electrode 24. With the gate sidewalls 26 and the gate electrode 24 serving as a mask, doping with As with a concentration of $10^{20}$ cm$^{-3}$ is performed to form a source-side high-concentration impurity region 30a and a drain-side high-concentration impurity region 30b. After the device structure shown in FIG. 13 is formed, annealing for impurity activation (spike annealing) is performed at 1050° C.

Figure 14:
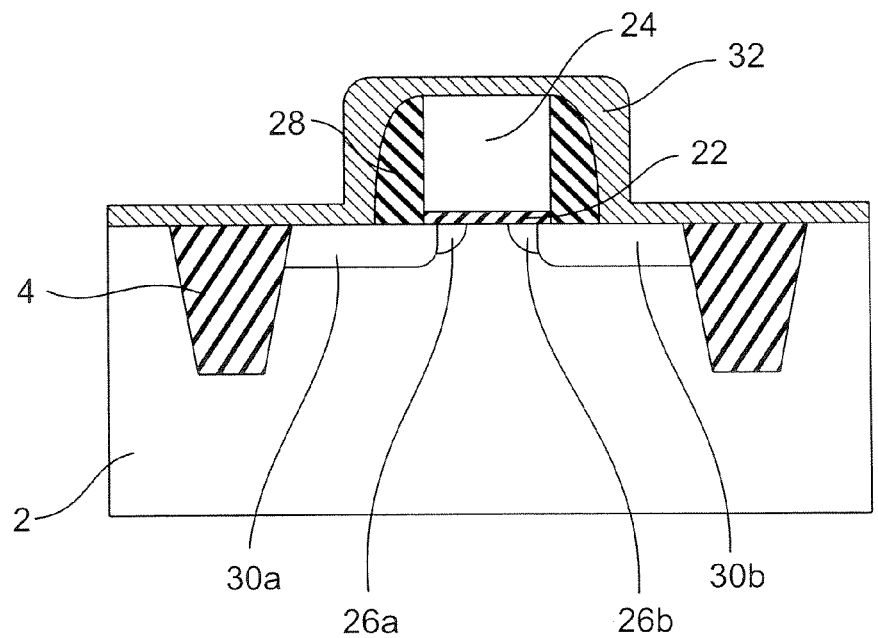
FIG. 14 is a cross-sectional view illustrating a step for manufacturing a MIS transistor of Example 5.
Figure 15:
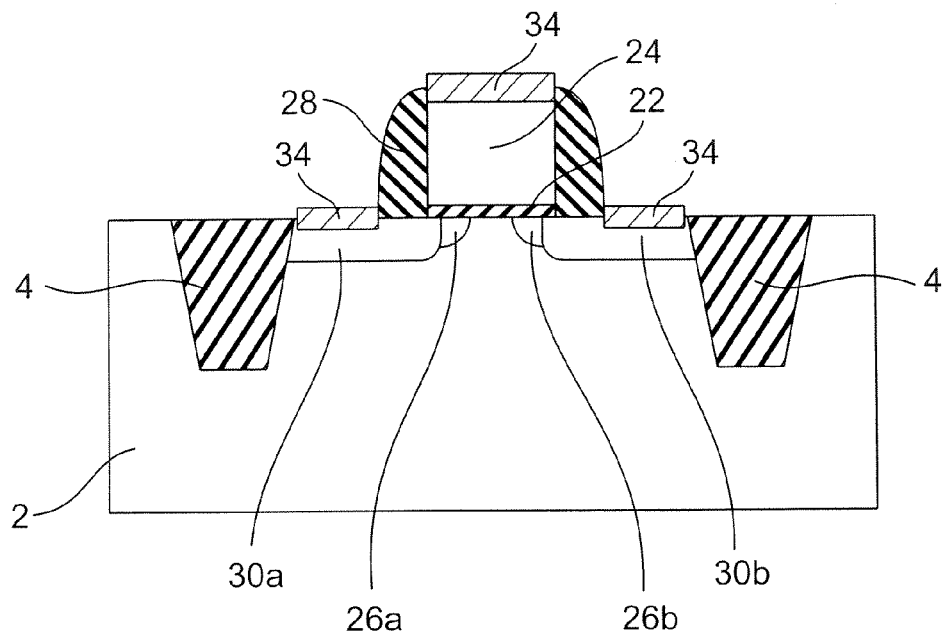
FIG. 15 is a cross-sectional view illustrating a step for manufacturing a MIS transistor of Example 5.

As shown in FIG. 14, a Ni film 32 of 12 nm in film thickness is then formed by a sputtering technique. Annealing is performed at 750° C. for 30 seconds, and a NiSi$_2$ film 34 is formed on the gate electrode 24 and the source and drain regions 30a and 30b, as shown in FIG. 15. The Ni that is not silicided is selectively removed with a chemical solution. Thus, the device structure shown in FIG. 15 is produced. At this point, the thickness of each NiSi$_2$ film 34 is 15 nm.

Figure 16:
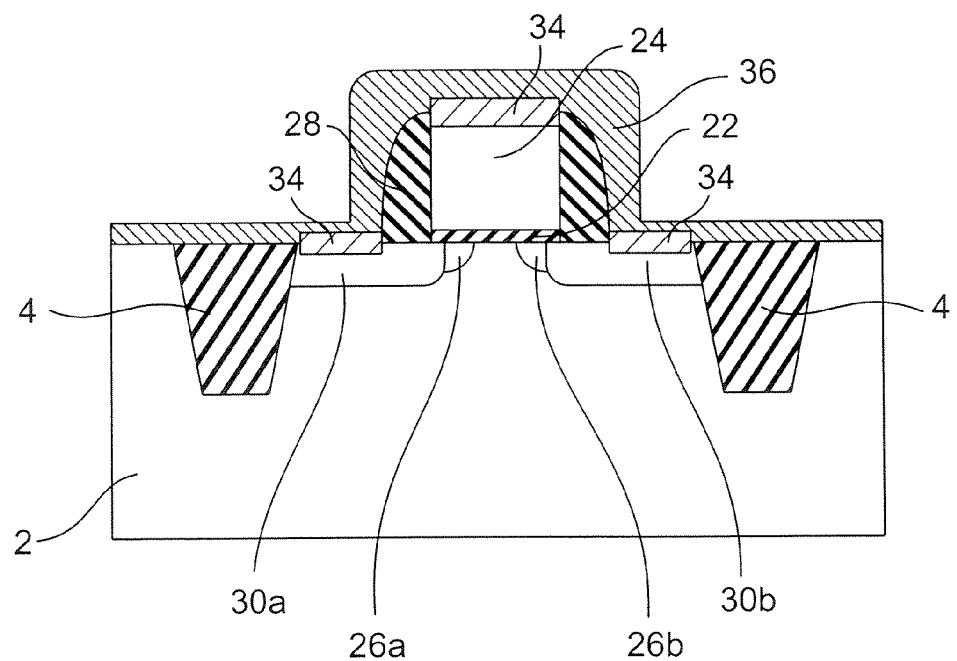
FIG. 16 is a cross-sectional view illustrating a step for manufacturing a MIS transistor of Example 5.
Figure 17:
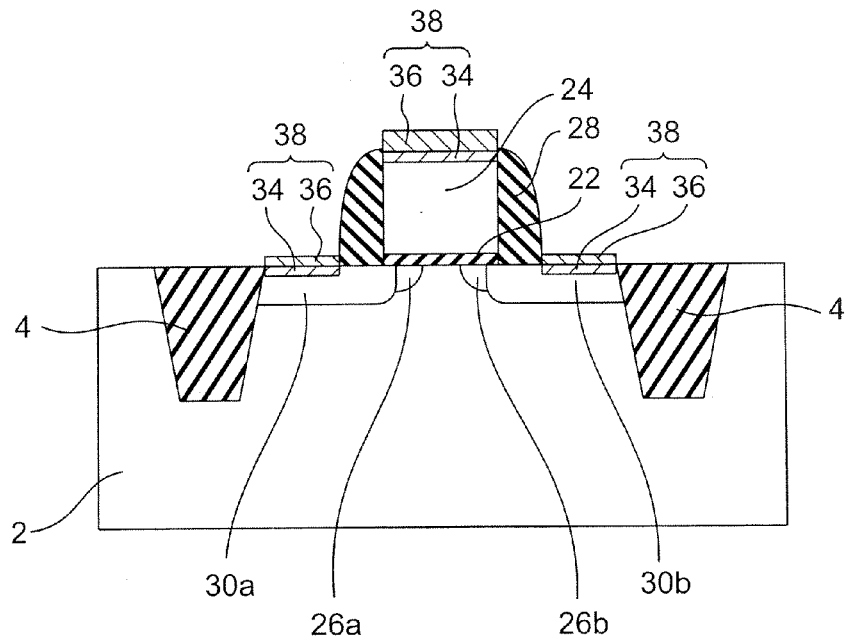
FIG. 17 is a cross-sectional view illustrating a step for manufacturing a MIS transistor of Example 5.

A Ni film 36 of 10 nm in film thickness is formed by a sputtering technique, as shown in FIG. 16. Annealing is then performed at 400° C. for 30 seconds, and the Ni that is not silicided is selectively removed with a chemical solution. As shown in FIG. 17, a nickel silicide laminated film 38 that consists of the NiSi$_2$ film 34 and the NiSi film 36 is formed on the gate electrode 24 and the source and drain regions 30a and 30b. At this point, the nickel silicide laminated film 38 has a NiSi film of 18 nm in thickness formed on a NiSi$_2$ film of 4 nm in thickness, as in the Schottky diode of Example 1. Thus, the n-type MIS transistor of Example 5 is completed.

COMPARATIVE EXAMPLE 3

For comparison with Example 5, an n-type MIS transistor is produced as Comparative Example 3. More specifically, the device structure shown in FIG. 13 is formed through the same procedures as those of Example 5, and a silicide film on the gate electrode 24 and the source and drain regions 30a and 30b is formed by the conventional nickel silicide process shown in FIG. 25. This MIS transistor of Comparative Example 3 is produced through exactly the same procedures as those of Example 5 until the procedure shown in FIG. 13. After a Ni film is deposited on the entire substrate surface, annealing is performed at 350° C. for 30 seconds, to form a Ni$_2$Si film. The Ni that is not silicided is then selectively removed with a chemical solution. Annealing is next performed at 500° C. for 30 seconds, to change the Ni$_2$Si film into a NiSi film. Thus, the n-type MIS transistor of Comparative Example 3 is completed. At this point, the film thickness of the NiSi film is 15 nm.

Figure 18:
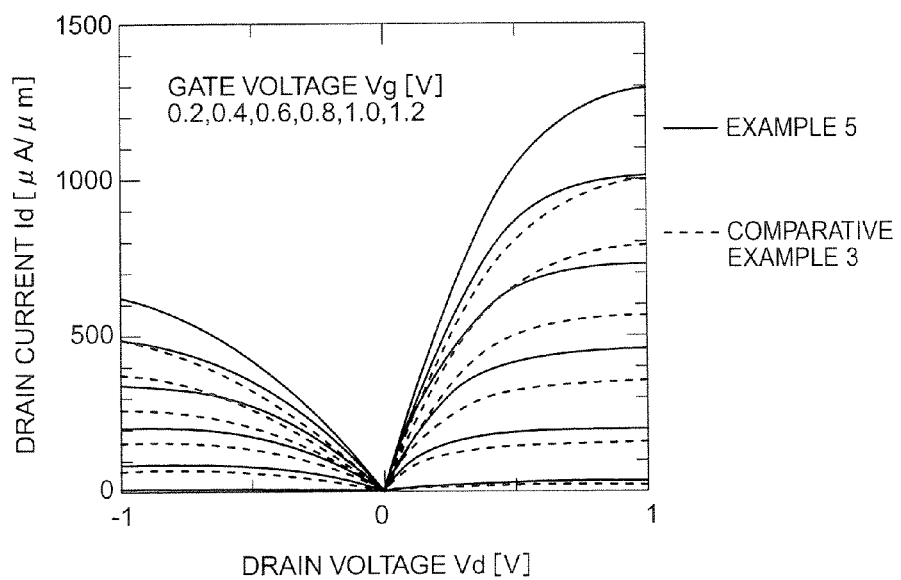
FIG. 18 is a diagram showing the dependence of the drain current on the gate voltage in each of the MIS transistors of Example 5 and Comparative Example 3.

Next, we show the dependence of drain current on gate voltage in each of the MIS transistors of Example 5 and Comparative Example 3, As can be seen from FIG. 18, the dependence of the drain current on the gate voltage in the MIS transistor of Example 5 shows a 30% current increase in comparison with the MIS transistor of Comparative Example 3, due to the decrease in interface resistance in the source and drain regions.

EXAMPLE 6

Next, a method of manufacturing a MIS transistor of Example 6 is described. Although the extension regions 26a and 26b are formed before the formation of the high-concentration impurity regions 30a and 30b in Example 5, the extension regions 26a and 26b may be formed after the formation of the high-concentration impurity regions 30a and 30b. The manufacturing method of this example is the same as the manufacturing method of Example 5, except that the extension regions 26a and 26b are formed after the formation of the high-concentration impurity regions 30a and 30b.

Figure 19:
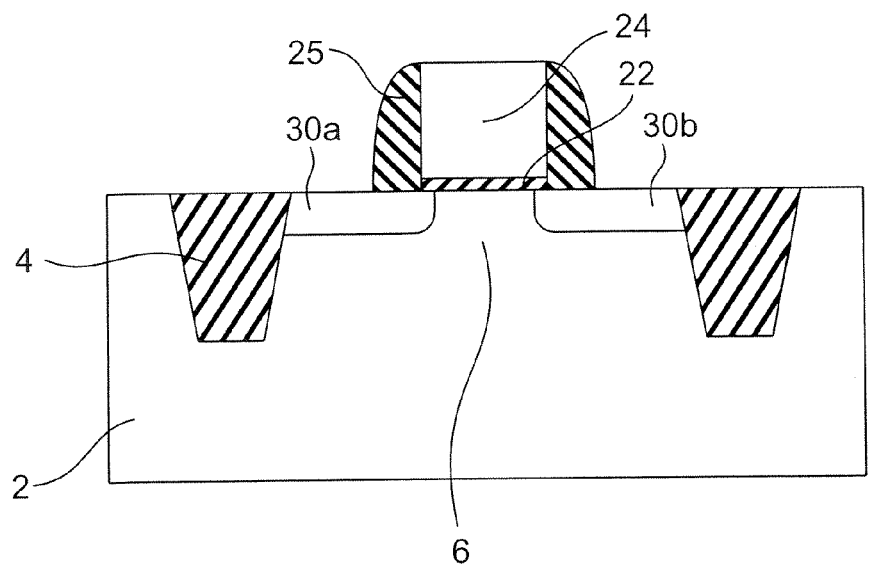
FIG. 19 is a cross-sectional view illustrating a step for manufacturing a MIS transistor of Example 6.

First, as shown in FIG. 19, a gate insulating film 22 is formed on each of device regions 6 isolated from one another by device isolating insulating films 4, and a gate electrode 24 is formed on the gate insulating film 22. Gate sidewalls 25 that are made of an insulating material and are used for impurity injection are formed on the side portions of the gate electrode 24. As the gate sidewalls 25 and the gate electrode 24 serving as a mask, impurities, such as As, are injected to form high-concentration impurity regions 30a and 30b. Activation annealing (spike annealing) is then performed at 1050° C.

Figure 20:
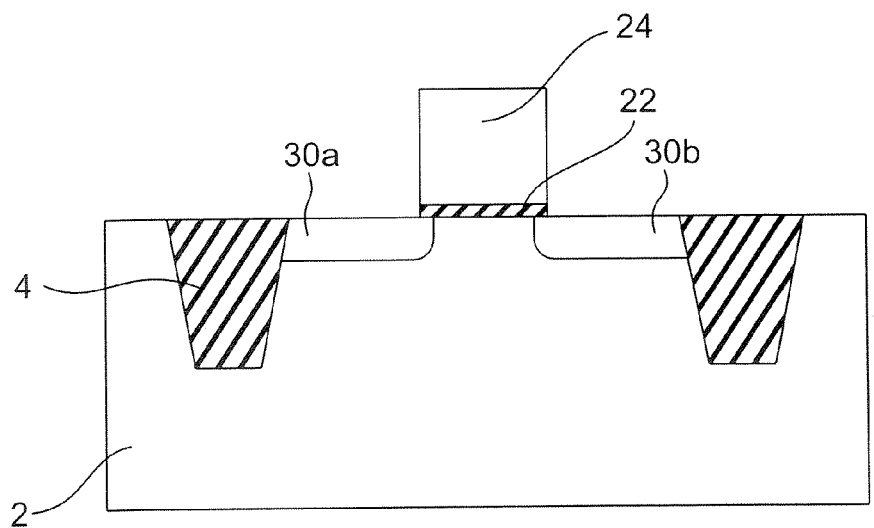
FIG. 20 is a cross-sectional view illustrating a step for manufacturing a MIS transistor of Example 6.
Figure 21:
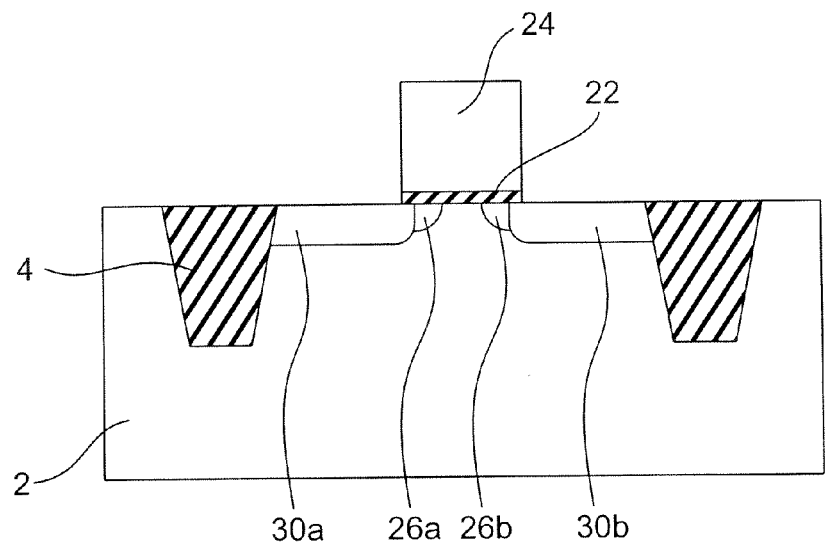
FIG. 21 is a cross-sectional view illustrating a step for manufacturing a MIS transistor of Example 6.

As shown in FIG. 20, the gate sidewalls 25 are removed. With the gate electrode 24 serving as a mask, shallower injection of impurities As than in the case of the high-concentration impurity regions 30a and 30b is carried out to form the extension regions 26a and 26b. After activation annealing such as FLA (Flash Lamp Annealing) or laser annealing is performed, gate sidewalls 28 also made of an insulating material are formed on the side portions of the gate electrode 24, thereby completing the device structure shown in FIG. 13. By this process, the influence of high-temperature activation annealing on the extension regions can be reduced.

The same procedures as those of Example 5 shown in FIGS. 14 to 17 are then carried out to form an n-type MIS transistor of Example 6. As in the MIS transistor of Example 5, the current in the MIS transistor of Example 6 can be made approximately 30% higher than the current in the MIS transistor of Comparative Example 3.

EXAMPLE 7

Next, a semiconductor device of Example 7 of the present invention is described. The semiconductor device of this example is a p-type MIS transistor that is the same as the MIS transistor of Example 5, except that the silicon substrate 2, the extension regions 26a and 26b, and the high-concentration impurity regions 30a and 30b each have the opposite conductivity from that in Example 5. As in the MIS transistor of Example 5, the current in the p-type MIS transistor of Example 7 can also be made approximately 30% higher than the current in the MIS transistor of Comparative Example 3.

EXAMPLE 8

Next, a semiconductor device of Example 8 of the present invention is described. The semiconductor device of this example is a p-type MIS transistor that is the same as the MIS transistor of Example 6, except that the silicon substrate 2, the extension regions 26a and 26b, and the high-concentration impurity regions 30a and 30b each have the opposite conductivity from that in Example 6.

In this example, the influence of high-temperature activation annealing on the extension regions can be reduced, as in Example 6. Also, as in the MIS transistor of Example 6, the current in the p-type MIS transistor of Example 8 can be made approximately 30% higher than the current in the MIS transistor of Comparative Example 3.

EXAMPLE 9

Figure 22:
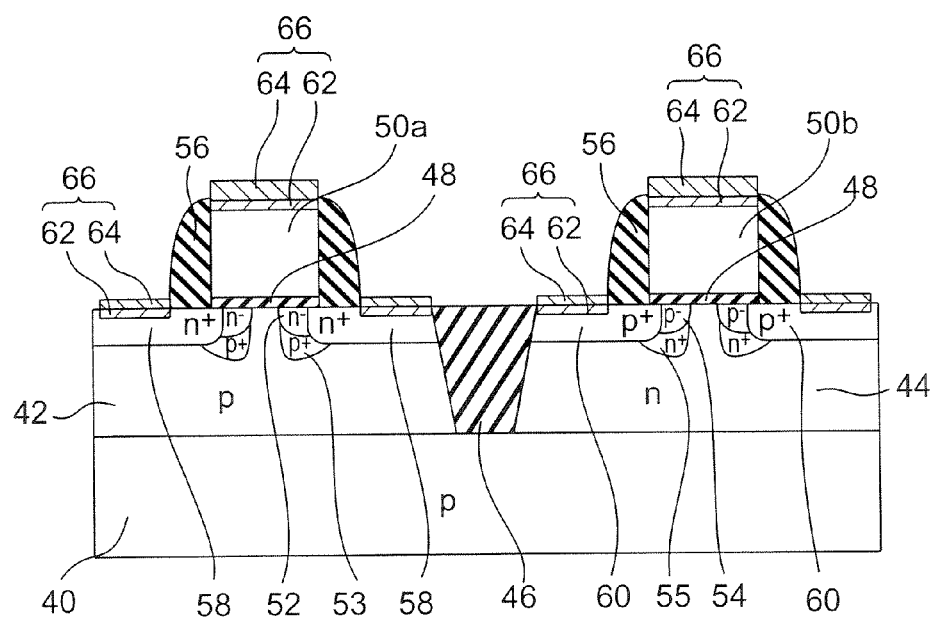
FIG. 22 is a cross-sectional view showing a CMOS device of Example 9.

FIG. 22 illustrates a semiconductor device of Example 9 of the present invention. The semiconductor device of this example is a CMOS device.

In the CMOS device of this example, a p-well 42 and an n-well 44 that are isolated from each other by a device isolating insulating film 46 are formed on a p-type silicon substrate 40. An n-type transistor is provided on the p-well 42, and a p-type MOS transistor is provided on the n-well 44.

The n-type MOS transistor includes the MIS transistor of Example 5 and pocket regions 53, while the p-type MOS transistor includes the MIS transistor of Example 7 and pocket regions 55. Besides that, the n-type MOS transistor and the p-type MOS transistor have the same structures. More specifically, in the n-type MOS transistor, a gate insulating film 48 is provided on the p-well 42, and a gate electrode 50a is provided on the gate insulating film 48. Gate sidewalls 56 are formed on the side portions of the gate electrode 50a, and n$^+$-type high-concentration impurity regions 58 are formed in the p-well 42 on both sides of the gate electrode 50a. Further, n$^-$-type extension regions 52 that connect to the high-concentration impurity regions 58 are formed in the portion of p-well 42 immediately below the gate electrode 50a. Below the extension regions 52, p$^+$-type pocket regions 53 to which p-type impurities are injected are provided. A silicide film 66 of a laminated structure including a NiSi$_2$ film 62 and a NiSi film 64 is formed over the high-concentration impurity regions 58 and the gate electrode 50a.

Meanwhile, in the p-type MOS transistor, a gate insulating film 48 is provided on the n-well 44, and a gate electrode 50b is provided on the gate insulating film 48. Gate sidewalls 56 are formed on the side portions of the gate electrode 50b, and p$^+$-type high-concentration impurity regions 60 are formed in the n-well 44 on both sides of the gate electrode 50b. Further, p$^-$-type extension regions 54 that connect to the high-concentration impurity regions 60 are formed in the portion of n-well 44 immediately below the gate electrode 50b. Below the extension regions 54, n$^+$-type pocket regions 55 to which n-type impurities are injected are provided. A silicide film 66 of a laminated structure including a NiSi$_2$ film 62 and a NiSi film 64 is formed over the high-concentration impurity regions 60 and the gate electrode 50b.

The n-type MOS transistor and the p-type MOS transistor operate in a complementary fashion, thereby forming the CMOS device. Like each of the MIS transistors of Example 5 to Example 8, the CMOS device of Example 9 can be formed by forming a Ni film by a sputtering technique after the formation of a NiSi$_2$ film, and performing annealing at 500° C. or lower. Thus, the resistance in the source and drain regions can be reduced, and the drive current can be increased, as in each of the MIS transistors of Example 5 to Example 8.

EXAMPLE 10

Figure 23A:
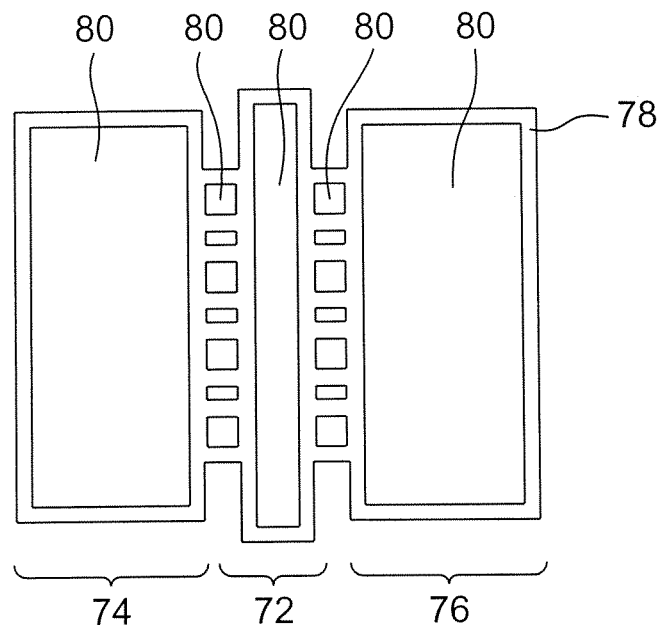
FIGS. 23A and 23B are a plan view and a front view showing a Fin channel transistor of Example 10.
Figure 23B:
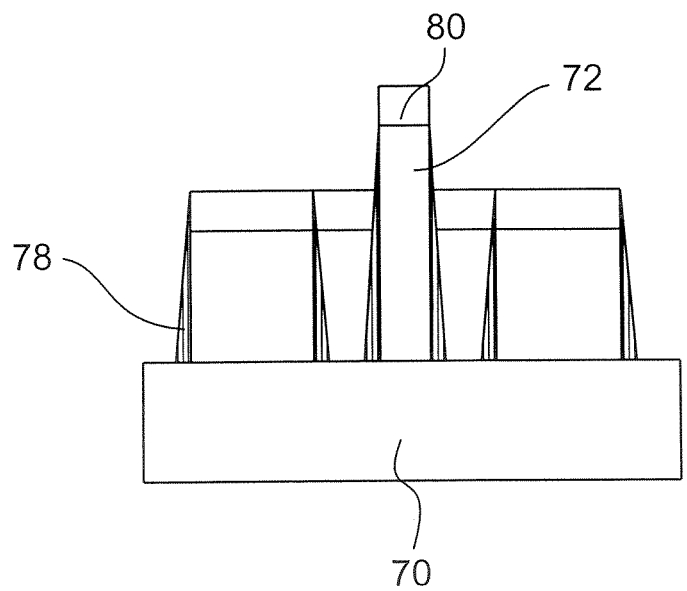

FIGS. 23A and 23B illustrate a semiconductor device of Example 10 of the present invention. The semiconductor device of this example is a Fin channel transistor. FIG. 23A is a plan view of the Fin channel transistor, and FIG. 23B is a front view of the Fin channel transistor.

In the Fin channel transistor of this example, semiconductor regions are provided between a source region 74 and a drain region 76, and a gate electrode 72 is formed across the semiconductor regions. The semiconductor regions located below the gate electrode 72 serve as channel regions. With this structure, current flows through more than one channel, and the current value can be increased accordingly.

As in each of the MIS transistors of Example 5 to Example 8, in the Fin channel transistor of this example, a nickel silicide laminated film 80 having a laminated structure of a NiSi$_2$ film and a NiSi film is provided on the gate electrode 72, the source region 74, and the drain region 76. With this arrangement, the interface resistance at the interface between the nickel silicide film and the silicon substrate can be reduced, as in each of the MIS transistors of Example 5 to Example 8. Thus, the resistance in the source and drain regions can be reduced, and the drive current can be increased. Further, sidewalls 78 that are made of an insulating material are provided to surround the gate electrode 72, the source region 74, and the drain region 76.

EXAMPLE 11

Figure 24:
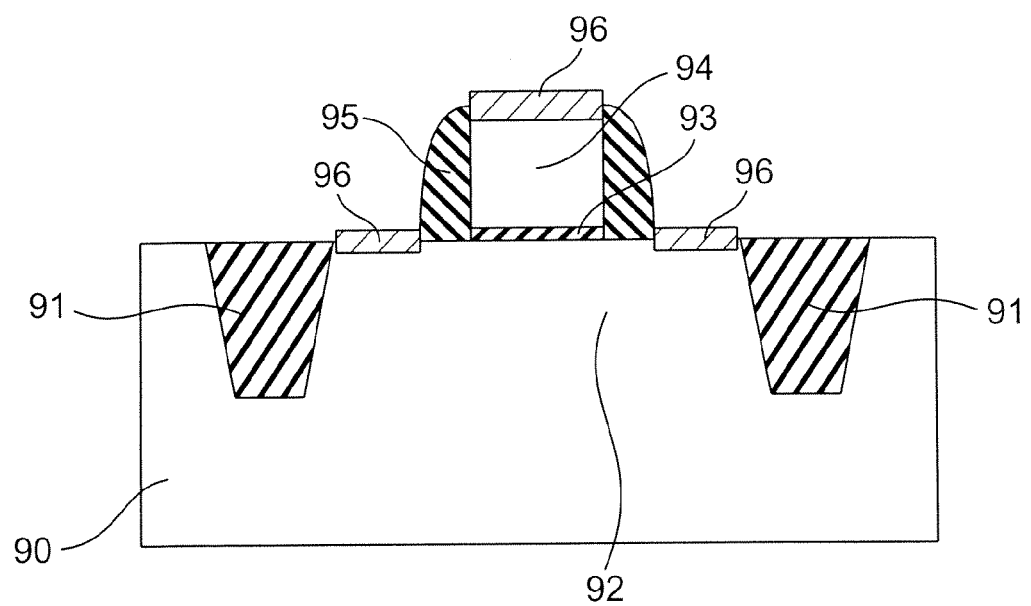
FIG. 24 is a cross-sectional view showing a Schottky transistor of Example 11.

FIG. 24 illustrates a semiconductor device of Example 11 of the present invention. The semiconductor device of this example is an n-type Schottky source-drain MIS transistor (hereinafter also referred to simply as a Schottky transistor). In this n-type Schottky MIS transistor, device regions 92 that are isolated from one another by device isolating insulating films 91 are provided on a p-type silicon substrate 90. A gate insulating film 93 is provided on each of the device regions 92, and a gate electrode 94 is formed on the gate insulating film 93. Gate sidewalls 95 that are made of an insulating material are provided on the side portions of the gate electrode 94, and a silicide laminated film 96 to be a source and a drain is formed in the portions of the device region 92 located outside the gate sidewalls 95. This silicide laminated film 96 has a laminated structure of a NiSi$_2$ film and a NiSi film, and is also placed on the gate electrode 94. The silicide laminated film 96 is manufactured by the same process as that explained in the descriptions of Example 5 to Example 8.

The n-type Schottky MIS transistor of this example differs from any of the MIS transistors of Example 5 to Example 8 in that the gate sidewalls 95 are thinner and the high-concentration impurity regions are not provided. More specifically, the Schottky transistor of this example is a transistor that does not have high-concentration impurity regions but has a silicide film formed directly on a silicon semiconductor substrate. In this transistor, the pn junction formed between the high-concentration impurity regions and the silicon substrate of each of Example 5 to Example 8 is replaced with a Schottky junction. Accordingly, problems such as a short channel effect and parasitic resistance that are likely to be caused when the MIS transistor becomes smaller according to the scaling rule can be effectively avoided.

As in each of the MIS transistors of Example 5 to Example 8, in the n-type Schottky source-drain MIS transistor, the interface resistance at the interface between the nickel silicide film and the silicon can be reduced. Thus, the resistance in the source and drain regions can be reduced, and the drive current can be increased.

EXAMPLE 12

Next, a semiconductor device of Example 12 of the present invention is described. The semiconductor device of this example is a p-type Schottky source-drain MIS transistor (also referred to simply as a Schottky transistor), and is manufactured in the same manner as the Schottky transistor of Example 11, except that it is formed on an n-type silicon substrate. As in the MIS transistor of Example 11, in the p-type Schottky source-drain MIS transistor, the interface resistance at the interface between the nickel silicide film and the silicon can be reduced. Thus, the resistance in the source and drain regions can be reduced, and the drive current can be increased.

As described so far, in each of the examples, the interface resistance at the interface between the nickel silicide film and the silicon can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method of manufacturing a semiconductor device, comprising:
   forming an impurity region on a silicon substrate, with impurities being introduced into the impurity region;
   depositing a Ni layer so as to cover the impurity region;
   changing the surface of the impurity region into a $NiSi_2$ layer through annealing;
   forming a Ni layer on the $NiSi_2$ layer; and
   silicidating the $NiSi_2$ layer through annealing.

2. The method of manufacturing a semiconductor device as claimed in claim 1, wherein a film thickness of the Ni layer deposited on the $NiSi_2$ layer is smaller than a film thickness of the $NiSi_2$ layer.

3. The method of manufacturing a semiconductor device as claimed in claim 1, wherein the silicidation of the $NiSi_2$ layer includes forming a silicide laminated film including a $NiSi_2$ layer and a NiSi layer.

4. The method of manufacturing a semiconductor device as claimed in claim 1, wherein the silicidation of the $NiSi_2$ layer includes performing annealing at a temperature of 500° C. Or lower.

5. The method of manufacturing a semiconductor device as claimed in claim 4, wherein the silicidation of the $NiSi_2$ layer includes performing annealing at a temperature of 400° C. Or lower.

6. The method of manufacturing a semiconductor device as claimed in claim 1, wherein the changing of the surface of the impurity region into a $NiSi_2$ layer comprising:
   changing the surface of the impurity region into a $Ni_2Si$ layer through annealing;
   changing the $Ni_2Si$ layer into a NiSi layer through annealing; and
   changing the NiSi layer into a $NiSi_2$ layer through annealing.

* * * * *